US012771378B2

(12) United States Patent
Eroz et al.

(10) Patent No.: US 12,771,378 B2
(45) Date of Patent: Oct. 20, 2026

(54) LOW-DENSITY PARITY-CHECK (LDPC) CODE GENERATION IN ASYNCHRONOUS SCRAMBLED CODED MULTIPLE ACCESS (ASCMA) TELECOMMUNICATION NETWORK

(71) Applicant: Hughes Network Systems, LLC, Germantown, MD (US)

(72) Inventors: Mustafa Eroz, Rockville, MD (US); Lin-Nan Lee, Potomac, MD (US)

(73) Assignee: HUGHES NETWORK SYSTEMS, LLC, Germantown, MD (US)

( * ) Notice: Subject to any disclaimer, the term of this patent is extended or adjusted under 35 U.S.C. 154(b) by 44 days.

(21) Appl. No.: 18/959,368

(22) Filed: Nov. 25, 2024

(65) Prior Publication Data

US 2026/0149466 A1 May 28, 2026

(51) Int. Cl.

| | |
|---|---|
| ***H03M 13/11*** | (2006.01) |
| ***H04J 13/00*** | (2011.01) |
| ***H04L 1/00*** | (2006.01) |

(52) U.S. Cl.

CPC ..... *H03M 13/1102* (2013.01); *H04J 13/0003* (2013.01); *H04L 1/0041* (2013.01); (Continued)

(58) Field of Classification Search

CPC ............ H03M 13/1102; H04J 13/0003; H04L 1/0063; H04L 1/0041; H04L 1/0048; H04L 1/005; H04L 1/0057

See application file for complete search history.

(56) References Cited

U.S. PATENT DOCUMENTS

2009/0028324 A1 1/2009 Eroz et al.
2010/0122143 A1 5/2010 Lee et al.
(Continued)

OTHER PUBLICATIONS

M. Eroz, N. Becker, R. I. Seshadri and L. -n. Lee, "New Results in Asynchronous Scrambled Coded Multiple Access: Multi-Stream Transmission and Application to 5G Small Data Networks," 2019 IEEE 90th Vehicular Technology Conference (VTC2019-Fall), Honolulu, HI, USA, 2019, pp. 1-6 (Year: 2019).*
(Continued)

*Primary Examiner* — Cynthia Britt
(74) *Attorney, Agent, or Firm* — Mannava & Kang, P.C

(57) ABSTRACT

Systems and methods a system for generating Low-Density Parity-Check (LDPC) code for enabling multiple simultaneous users in Asynchronous Scrambled Coded Multiple Access (ASCMA). The system includes transmitter node with source endpoints, each equipped with an encoder unit generating LDPC codeword bits from information bits. An encoder aggregates LDPC codeword bits with replicated information bits to create an aggregated sequence. A modulator unit modulates the sequence into a waveform for transmission over a shared spectrum access channel. The transmitted waveform is asynchronously sent to a receiver node, which includes a gateway linked to destination endpoints. The receiver unit captures a noise-corrupted version of the waveform, and a decoder unit, using soft-input and soft-output techniques, decodes information bits. A Multi-User Interference (MUI) estimator cancels interference levels, allowing the decoder to recover the original information bits associated with the source endpoints.

20 Claims, 17 Drawing Sheets

(52) U.S. Cl.
CPC ............ *H04L 1/0048* (2013.01); *H04L 1/005* (2013.01); *H04L 1/0057* (2013.01); *H04L 1/0063* (2013.01)

(56) References Cited

U.S. PATENT DOCUMENTS

| | | | | |
|---|---|---|---|---|
| 2025/0267448 | A1 * | 8/2025 | Zhang | H04W 76/16 |
| 2025/0274744 | A1 * | 8/2025 | Chatterjee | H04W 8/24 |

OTHER PUBLICATIONS

N. Becker, S. Kay, L. -n. Lee and M. Eroz, "Spread Asynchronous Scrambled Coded Multiple Access (SA-SCMA)—A New Efficient Random Access Method," 2016 IEEE Global Communications Conference (GLOBECOM), Washington, DC, USA, 2016, pp. 1-6 (Year: 2016).*

L. Ping, L. Liu, K. Y. Wu and W. K. Leung, "Interleave division multiple access (IDMA) communications", in Proc. Int. Symp. Turbo Codes Related Topics, Brest, France, Sep. 2003, pp. 173-180.

M. Eroz and L. Lee, "Scrambled Coded Multiple Access," 2011 IEEE Vehicular Technology Conference, Fall 2011, 5 pages.

M. Eroz and L. Lee, "On FEC design for interleave division multiple access", in Proc. VTC'10, Taipei May 2010, 4 pages.

N. Becker, M. Eroz, S. Kay, and L. Lee, "Asynchronous Scrambled Coded Multiple Access (A-SCMA), A New High Efficiency Random Access Method" 2016 IEEE Vehicular Technology Conference, Fall 2016, 6 pages.

D. Divsalar et al., "Low-rate LDPC codes with simple protograph structure," Proceedings. International Symposium on Information Theory, 2005. ISIT 2005., Adelaide, SA, Australia, 2005, pp. 1622-1626, doi: 10.1109/ISIT.2005.1523619.

Li Ping et al., "Interleave division multiple-access," in IEEE Transactions on Wireless Communications, vol. 5, No. 4, pp. 938-947, Apr. 2006, doi: 10.1109/TWC.2006.1618943.

PCT, "International Search Report and Written Opinion for PCT Application No. PCT/US2025/055159", mailed Mar. 9, 2026, 14 pages.

* cited by examiner

1000A

1000B

1000C

1000D

LOW-DENSITY PARITY-CHECK (LDPC) CODE GENERATION IN ASYNCHRONOUS SCRAMBLED CODED MULTIPLE ACCESS (ASCMA) TELECOMMUNICATION NETWORK

TECHNICAL FIELD

This patent application is directed to satellite communication systems and, more specifically, to systems and methods for generating Low-Density Parity-Check (LDPC) codes for allowing a plurality of simultaneous users in an Asynchronous Scrambled Coded Multiple Access (ASCMA) telecommunication network.

BACKGROUND

Radio communication systems include multiple access techniques to allow a plurality of users to share limited bandwidth, while ensuring appropriate system performance. The performance may further be enhanced by using error control codes, which are essential for mitigating errors arising from noise and other factors during data transmission. Such systems are utilized in various applications, including satellite, fiber-optic, cellular, and broadcast communications. Effective error control mechanisms implemented at a transmitter may enable transmission of data with minimal error rates within a specified Signal-to-Noise Ratio (SNR). Furthermore, the error control schemes may be critical for achieving target error rates in low-SNR environments, such as satellite and wireless systems, where noise is prevalent, and high transmission power is impractical.

To address the aforementioned challenges, various error control schemes, including convolutional codes, Low-Density Parity Check (LDPC) codes, and turbo codes, may have been developed. LDPC codes and specific turbo codes may be particularly notable for approaching a theoretical Shannon limit. Although convolutional codes with extended constraint lengths may also approach the Shannon limit, the complexity of decoders may hinder practical implementation. In contrast, LDPC and turbo codes achieve low error rates with comparatively less complex decoders.

Among the conventional systems, communication systems that utilize iterative error correction codes, particularly LDPC codes, may have garnered significant attention. The conventional systems may often demonstrate lower Bit Error Rates (BER) than alternative coding schemes for a given SNR. A primary objective of communication systems may be to continually reduce a required SNR to achieve a specific BER, to approach the Shannon limit, which defines the maximum achievable data rate for a given SNR that ensures error-free transmission. The LDPC codes may exhibit exceptional decoding performance, for example operating within, for example, 0.3 dB of the Shannon limit. In high-data-rate communication applications, near-capacity error correction codes may particularly be desirable, due to latency associated with conventional concatenated codes.

In systems utilizing the LDPC codes, one device at one end of the communication channel may serve as the encoder, while another device at opposite end functions as the decoder. In some scenarios, both devices may possess both encoding and decoding capabilities, particularly in bi-directional communication systems. LDPC codes may be widely used in data storage systems, such as hard disk drives, where data is encoded before storage and decoded upon retrieval. A significant challenge in designing LDPC decoders is a substantial memory required to store and update bit edge and check edge messages during iterative decoding, especially for large block sizes, underscoring the need for continuous advancements in decoding techniques.

Additionally, conventional Scrambled Coded Multiple Access (SCMA) technique in the conventional communication systems may allow multiple terminals to transmit simultaneously on a same frequency band without the need for channel assignment. However, the SCMA requires synchronized codeword boundaries and as a result increases multi-user interference.

Consequently, there may be a need to provide improved systems and methods for generating Low-Density Parity-Check (LDPC) codes for allowing a plurality of simultaneous users in an Asynchronous Scrambled Coded Multiple Access (ASCMA) telecommunication network, and to address at least the aforementioned issues.

SUMMARY

This summary is provided to introduce a selection of concepts, in a simple manner, which is further described in the detailed description of the disclosure. This summary is neither intended to identify key or essential inventive concepts of the subject matter nor to determine the scope of the disclosure.

An aspect of the present disclosure provides a system for generating Low-Density Parity-Check (LDPC) code in an Asynchronous Scrambled Coded Multiple Access (ASCMA) telecommunication network. The system includes a transmitter node with a plurality of source endpoints associated with an Asynchronous Scrambled Coded Multiple Access (ASCMA) telecommunication network. Each of the plurality of source endpoints includes an encoder unit. The encoder unit generates a set of low-rate Low-Density Parity Check (LDPC) codeword bits corresponding to a set of information bits associated with each of the plurality of source endpoints. Further, the encoder unit aggregates the generated set of low-rate LDPC codeword bits with a plurality of replication of the set of information bits to generate an aggregated sequence of codeword bits. Furthermore, each of the plurality of source endpoints includes a modulator unit communicatively coupled to the encoder unit. The modulator unit modulates the aggregated sequence of the codeword bits into a waveform for transmission over a shared spectrum access channel. Further, the modulator unit includes a transmitter unit communicatively coupled to the modulator unit to transmit the modulated waveform to a receiver node, over the shared spectrum access channel, by using asynchronous codeword boundaries. Furthermore, the system includes the receiver node comprising a gateway associated with a plurality of destination endpoints in the ASCMA telecommunication network. The gateway includes a receiver unit. The receiver unit receives the modulated waveform from the transmitter unit associated with the transmitter node. The received waveform is a noise corrupted version of the transmitted waveform. Furthermore, the gateway includes a decoder unit associated with the receiver unit. The decoder unit decodes the set of information bits using a soft-input and a soft-output decoding technique, based on receiving the modulated waveform. Furthermore, the gateway includes a Multi-User Interference (MUI) estimator unit communicatively coupled to the decoder unit. The MUI estimator unit mitigates the plurality of interference levels in the received waveform, using a Multi-User Interference (MUI) cancellation technique. Furthermore, the decoder unit generates the set of information bits associated with each of the plurality of source endpoints, based on mitigating the plurality of interference levels in the received waveform.

Another aspect of the present disclosure provides a method for generating a Low-Density Parity-Check (LDPC) code in an Asynchronous Scrambled Coded Multiple Access (ASCMA) telecommunication network. The method includes generating a set of low-rate Low-Density Parity Check (LDPC) codeword bits corresponding to a set of information bits associated with each of a plurality of source endpoints. Furthermore, the method includes aggregating the generated set of low-rate LDPC codeword bits with a plurality of replication of the set of information bits to generate an aggregated sequence of codeword bits. Additionally, the method includes modulating the aggregated sequence of the codeword bits into a waveform for transmission over a shared spectrum access channel. Furthermore, the method includes transmitting the modulated waveform to a receiver node, over the shared spectrum access channel, by using asynchronous codeword boundaries. Additionally, the method includes receiving the modulated waveform from a transmitter unit associated with the transmitter node. The received waveform is a noise corrupted version of the transmitted waveform. Further, the method includes decoding the set of information bits using a soft-input and a soft-output decoding technique, based on receiving the modulated waveform. Furthermore, the method includes mitigating the plurality of interference levels in the received waveform, using a Multi-User Interference (MUI) cancellation technique. Additionally, the method includes generating the set of information bits associated with each of the plurality of source endpoints, based on mitigating the plurality of interference levels in the received waveform.

Yet another aspect of the present disclosure provides a non-transitory computer-readable medium comprising machine-readable instructions. That are executable by a processor to generate a set of low-rate Low-Density Parity Check (LDPC) codeword bits corresponding to a set of information bits associated with each of a plurality of source endpoints. Further, the processor aggregates the generated set of low-rate LDPC codeword bits with a plurality of replication of the set of information bits to generate an aggregated sequence of codeword bits. Furthermore, the processor modulates the aggregated sequence of the codeword bits into a waveform for transmission over a shared spectrum access channel. Additionally, the processor transmits the modulated waveform of the codeword bits to a receiver node, over the shared spectrum access channel, by using asynchronous codeword boundaries. Further, the processor receives the modulated waveform from a transmitter unit associated with the transmitter node. The received waveform is a noise corrupted version of the transmitted waveform. Furthermore, the processor decodes the set of information bits using a soft-input and a soft-output decoding technique, based on receiving the modulated waveform. Further, the processor mitigates the plurality of interference levels in the received waveform, using a Multi-User Interference (MUI) cancellation technique. Additionally, the processor generates the set of information bits associated with each of the plurality of source endpoints, based on mitigating the plurality of interference levels in the received waveform.

To further clarify the features of the present disclosure, a more particular description of the disclosure will follow by reference to specific embodiments thereof, which are illustrated in the appended figures. It is to be appreciated that these figures depict only typical embodiments of the disclosure and are therefore not to be considered limiting in scope. The disclosure will be described and explained with additional specificity and detail with the appended figures.

BRIEF DESCRIPTION OF THE DRAWINGS

Features of the disclosed embodiments are illustrated by way of example and not limited in the following Figure(s), in which like numerals indicate like elements, in which.

Figure 1:
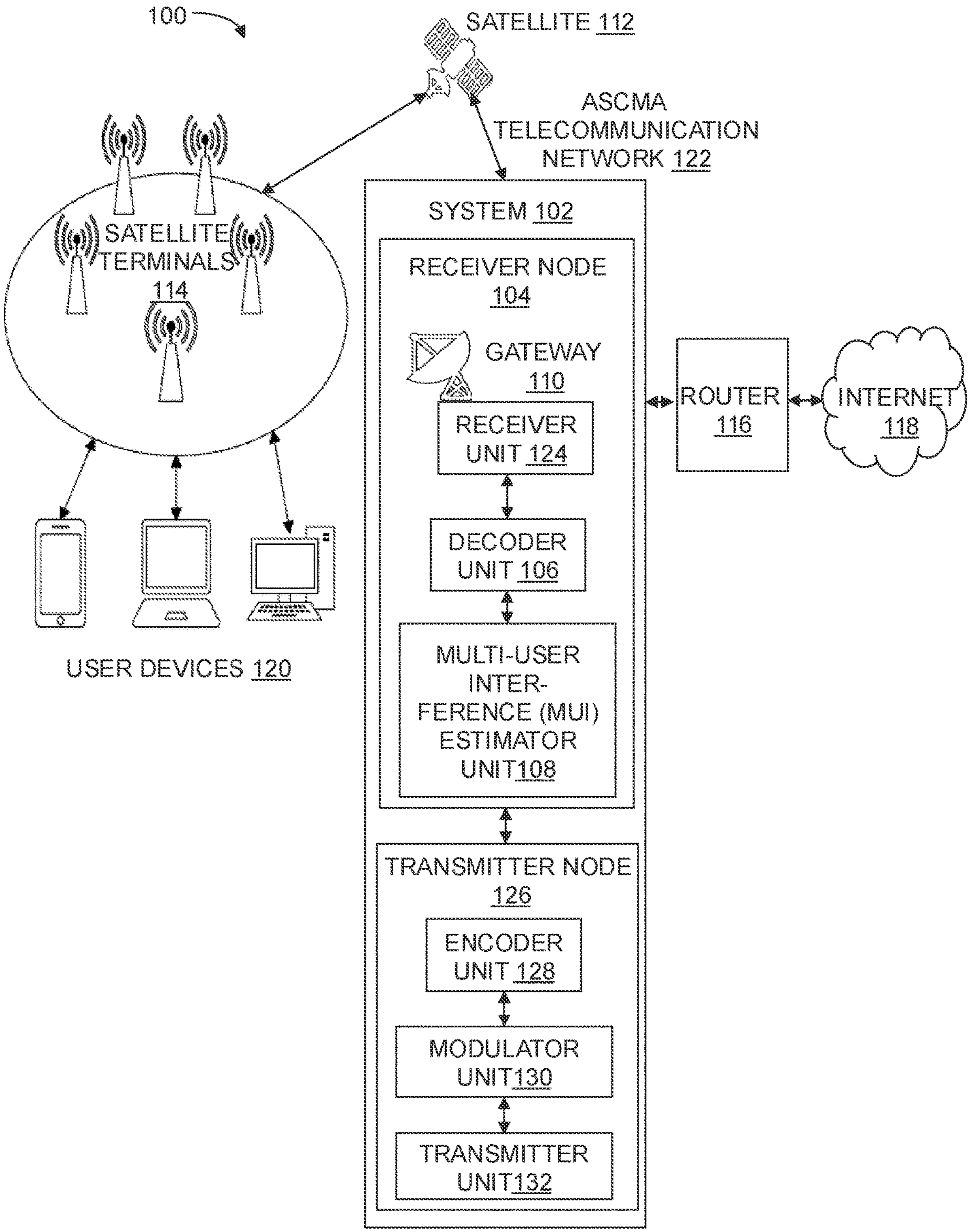
FIG. 1 illustrates a block diagram representation of a network architecture of a system for generating Low-Density Parity-Check (LDPC) codes in an Asynchronous Scrambled Coded Multiple Access (ASCMA) telecommunication network, according to an example.

Further, those skilled in the art will appreciate that elements in the figures are illustrated for simplicity and may not have necessarily been drawn to scale. Furthermore, in terms of the construction of the device, one or more components of the device may have been represented in the figures by conventional symbols, and the figures may show only those specific details that are pertinent to understanding the examples of the present disclosure so as not to obscure the figures with details that will be readily apparent to those skilled in the art having the benefit of the description herein.

DETAILED DESCRIPTION

For simplicity and illustrative purposes, the proposed approach and solutions are described by referring mainly to examples and embodiments thereof. In the following description, numerous specific details are set forth in order to provide a thorough understanding of the proposed approach and solutions. It will be readily apparent, however, that the proposed approach and solutions may be practiced without limitation to these specific details. In other instances, some methods and structures readily understood by one of ordinary skill in the art have not been described in detail so as not to unnecessarily obscure the ongoing description. As used herein, the terms "a" and "an" are intended to denote at least one of a particular element, the term "includes" means includes but not limited to, the term "including" means including but not limited to, and the term "based on" means based at least in part on, the term "based upon" means based at least in part upon, and the term "such as" means such as but not limited to. The term "relevant" means closely connected or appropriate to what is being performed or considered.

The terms "comprise", "comprising", or any other variations thereof, are intended to cover a non-exclusive inclusion, such that one or more devices or sub-systems or elements or structures or components preceded by "comprises . . . a" does not, without more constraints, preclude the existence of other devices, sub-systems, additional sub-modules.

A computer system (standalone, client or server computer system) configured by an application may constitute a "module" (or "subsystem") that is configured and operated to perform certain operations. In one example, the "module" or "subsystem" may be implemented mechanically or electronically, so a module includes dedicated circuitry or logic that is permanently configured (within a special-purpose processor) to perform certain operations. In another example, a "module" or "subsystem" may also comprise programmable logic or circuitry (as encompassed within a general-purpose processor or other programmable processor) that is temporarily configured by software to perform certain operations.

Accordingly, the term "module" or "subsystem" should be understood to encompass a tangible entity, be that an entity that is physically constructed permanently configured (hardwired) or temporarily configured (programmed) to operate in a certain manner and/or to perform certain operations described herein.

Unless otherwise defined, all technical and scientific terms used herein have the same meaning as commonly understood by those skilled in the art to which this disclosure belongs. The system, methods, and examples provided herein are only illustrative and not intended to be limiting.

A system, method, and non-transitory computer-readable medium for providing an Asynchronous Scrambled Coded Multiple Access (ASCMA) scheme is described. In the following description, for the purposes of explanation, numerous specific details are set forth to provide a thorough understanding of the present disclosure. It is apparent, however, that the present disclosure may be practiced without these specific details or with an equivalent arrangement. In other instances, well-known structures and devices are shown in block diagram form in order to avoid unnecessarily obscuring the present disclosure.

Although certain examples of the present disclosure are described with respect to low-rate turbo codes, it is contemplated that these examples have applicability to low-rate codes in general (for example, low density parity check (LDPC)). The Low-Density Parity-Check (LDPC) codes are capacity approaching forward Error Correcting Codes (ECCs) that are being adopted in an increasing number of communication standards (for example, IEEE 802.3an, IEEE 802.11n, 802.20, DVB-S2). Relevant application domains may include, but not limited to, magnetic recording, wireless, high speed data transmission over copper and optical fiber, and the like.

In one example, the LDPC decoding processing is performed using an iterative decoding approach in which messages (for example, check edge messages and bit edge messages [or alternatively referred to as "variable edge messages"]) are passed back and forth when performing check node processing (alternatively referred to as check engine processing) and bit node processing (alternatively referred to as bit engine processing). Further, may be referred to as message passing decoding processing that operates on a graph representation of the code (for example, a LDPC bipartite graph (also referred to as a "Tanner" graph in the art)). One of the key hardware implementation challenges is the management of the large number of messages that must be exchanged during each decoder iteration. Herein, various approaches are presented that allow for a reduction in the memory requirement, certain hardware requirements (for example, no requirement for a barrel shifter or any large fan-in Multiplexer (MUX), or large memory such as Random Access Memory (RAM) as is oftentimes used to store the check edge messages and bit edge messages). In addition, a novel means for performing decoding processing performed in accordance with various aspects of the present disclosure may also provide for a high throughput. Instead, an approach of employing one or more daisy chains each having appropriately placed registers and mainly localized MUXs (for example, MUXs with merely 2 inputs each) operate to perform the appropriate shifting and alignment of the check edge messages and bit edge messages for check node processing and bit node processing, respectively. In some examples, the approach herein may capitalize upon the fact that a low-density parity check matrix, H, of the LDPC code may be composed of sub-matrices. For example, sub-matrix-based processing can be employed when processing the low-density parity check matrix, H, and this characteristic of the low-density parity-check matrix, H, (for example, being composed of sub-matrices) may be exploited to provide for improved architectures and efficiencies.

Within each daisy chain, each register stores a bit edge message or a check edge message at any given time, and the MUXs operate to select which of the bit edge messages or check edge messages are going to be updated during a given processing time. The connectivity of when the one or more-bit engines and one or more check engines couple to the daisy chain is based on the locations of non-null elements within the low-density parity-check matrix, H. In other words, from certain perspectives, the hard-wired connectivity of the daisy chain corresponds to the low-density parity check matrix, H.

Also, generally, when decoding on a sub-matrix based basis, the approach herein may employ "N" bit engines, and "M" check engines when each sub-matrix has a size of "XXX", such that each of X/M and X/N each form a first and/or second integer value. In other words, the number of bit engines employed need not be the same as the number of check engines employed. Alternatively, if these conditions are not met (for example, one or both of X/M and X/N forms a non-integer value), then there may be one or more some bit engines and/or check engines are idle when performing bit node processing or check node processing, respectively.

Examples herein include an LDPC decoding architecture leveraging a distributed processing technique to increase data throughput and reduce memory storage requirements. Routing congestion and critical path latency are also improved. The decoding approach herein may also be applied to LDPC codes operating on a low-density parity-check matrix, H, consisting of circularly shifted identity matrix sub-blocks. In some examples, the entire low-density parity-check matrix, H, is broken into square sub-matrices such that each sub-matrix consists of either a Cyclic Shifted Identity (CSI) matrix or a null matrix (all zeroes). A CSI sub-matrix is generated using cyclic shifting of an identity matrix (for example, a CSI sub-matrix can be generated by performing cyclic shifting when starting with an original sub-matrix which is an identity matrix such that all diagonal column elements. When starting in the upper left-hand entry and continuing down and to the right until reaching the bottom right-hand element, are all a value of "1", and all other elements therein are "0"). In the instance of when a low-density parity-check matrix, H, being employed to decode an LDPC coded signal includes sub-matrices that include CSI format, then the CSI offset per sub-matrix should be known. The CSI offset is the cyclic shifting required from an original identity matrix that is needed to generate the CSI matrix of interest.

It is noted that any of the following examples and approaches described herein are applicable regardless of the overall LDPC decoder architecture, for example, whether fully parallel, partially parallel, or serial in architecture/hardware implementation.

The goal of digital communications systems is to transmit digital data from one location, or subsystem, to another either error free, interference free, or with an acceptably low error rate. As shown in FIG. 1, data may be transmitted over a variety of communications channels in a wide variety of communication systems: magnetic media, wired, wireless, fiber, copper, and other types of media as well.

Examples of the present disclosure provide systems and methods for generating Low-Density Parity-Check (LDPC) codes to allow a plurality of simultaneous users in an Asynchronous Scrambled Coded Multiple Access (ASCMA) telecommunication network. The system includes a transmitter node with a plurality of source endpoints associated with an Asynchronous Scrambled Coded Multiple Access (ASCMA) telecommunication network. Each of the plurality of source endpoints includes an encoder unit. The encoder unit generates a set of low-rate Low-Density Parity Check (LDPC) codeword bits corresponding to a set of information bits associated with each of the plurality of source endpoints. Further, the encoder unit aggregates the generated set of low-rate LDPC codeword bits with a plurality of replication of the set of information bits to generate an aggregated sequence of codeword bits. Furthermore, each of the plurality of source endpoints includes a modulator unit communicatively coupled to the encoder unit to. The modulator unit modulates the aggregated sequence of the codeword bits into a waveform for transmission over a shared spectrum access channel. Further, the modulator unit includes a transmitter unit communicatively coupled to the modulator unit to transmit the modulated waveform to a receiver node, over the shared spectrum access channel, by using asynchronous codeword boundaries. Furthermore, the system includes the receiver node comprising a gateway associated with a plurality of destination endpoints in the ASCMA telecommunication network. The gateway includes a receiver unit. The receiver unit receives the modulated waveform from the transmitter unit associated with the transmitter node. The received waveform is a noise corrupted version of the transmitted waveform. Furthermore, the gateway includes a decoder unit associated with the receiver unit. The decoder unit decodes the set of information bits using a soft-input and a soft-output decoding technique, based on receiving the modulated waveform. Furthermore, the gateway includes a Multi-User Interference (MUI) estimator unit communicatively coupled to the decoder unit. The MUI estimator unit mitigates the plurality of interference levels in the received waveform, using a Multi-User Interference (MUI) cancellation technique. Furthermore, the decoder unit generates the set of information bits associated with each of the plurality of source endpoints, based on mitigating the plurality of interference levels in the received waveform.

Referring now to the drawings, and more particularly to FIGS. 1 through FIG. 12, where similar reference characters denote corresponding features consistently throughout the figures, there are shown preferred examples, and these examples are described in the context of the following exemplary system and/or method.

FIG. 1 illustrates a block diagram representation of a network architecture 100 of a system 102 for generating Low-Density Parity-Check (LDPC) codes in an Asynchronous Scrambled Coded Multiple Access (ASCMA) telecommunication network 122, according to an example. The network architecture 100 depicts a satellite communication system, however, the techniques may also be used in other communication systems. The network architecture 100 may include a system 102, a satellite 112, satellite terminals 114, a router 116, internet 118, one or more user devices 120 (individually referred to as the user device 120 and collectively referred to as the user devices 120). Further, the system 102 may include a receiver node 104, and a transmitter node 126. The receiver node 104 may include a receiver unit 124, a decoder unit 106, a Multi-User Interference (MUI) estimator unit 108, and a gateway 110.

Further, the transmitter node 126 includes an encoder unit 128, a modulator unit 130, a transmitter unit 132. The gateway 110 may communicate with the satellite 112. The satellite 112 may communicate with various satellite terminals such as the satellite terminals (STs) 114. The satellite 112 and the gateway 110 (along with potentially other network components) cooperate to transfer data to and from the satellite terminals 114 to a network associated with the router 116, which may include the Internet 118. Each of the satellite terminals 114 may be in communication with each of the plurality of user devices 120, which make use of the network connections provided by the gateway 110, the satellite 112, the satellite terminals 114, and the router 116. The user devices 120 may include, but not limited to, a mobile phone, a laptop computer, a desktop computer, a tablet, a phablet, a Personal Digital Assistant (PDA), a voice assistant, an Internet of Things (IoT) devices, a wearable device, a Augmented Reality/Virtual Reality (AR/VR) device, a metaverse device, a robot, an autonomous device, and the like.

In the example of the FIG. 1, the gateway 110 may include functionality to allocate limited data transfer bandwidth among the satellite terminals 114 that are concurrently connected. The network architecture 100 may use an Asynchronous Scrambled Coded Multiple Access (ASCMA) schema, or any other telecommunication network-based schema using Low-Density Parity-Check (LDPC) codes.

A digital communications system associated with the network architecture 100 may include one or more transmitters (not shown in FIG. 1) that generate signal waveforms across a communication channel (not shown in FIG. 1) to one or more receivers (not shown in FIG. 1). In this discrete communications system, the transmitter may include a message source that produces a discrete set of possible messages; each of the possible messages has a corresponding signal waveform. The signal waveforms may be attenuated, or otherwise altered, by communications channel. To combat the noise channel (not shown in FIG. 1), coding is utilized. For example, Forward Error Correction (FEC) codes may be employed.

The FEC may be required in terrestrial and satellite systems to provide high quality communication over a Radio Frequency (RF) propagation channel, which induces signal waveform and spectrum distortions, including signal attenuation (free space propagation loss) and multi-path induced fading. These impairments drive the design of the radio transmission and receiver equipment. Example design objectives include selecting modulation formats, error control schemes, demodulation and decoding techniques and hardware components that together provide an efficient balance between system performance and implementation complexity. Differences in propagation channel characteristics, such as between terrestrial and satellite communication channels, may result in significantly different system designs. Likewise, existing communication systems continue to evolve in order to satisfy increased system requirements for new higher rate or higher fidelity communication services.

Further, in the network architecture 100, each of the satellite terminals 114 may include a satellite beam assignment and a gateway assignment. In general, when the satellite terminals 114 is installed, a beam assignment (for example, a spot beam of the satellite 112) may be determined based on a location of the satellite terminals 114.

The satellite 112 that supports communication among multiple terminals. The terminals herein referred to as the Satellite Terminals (STs) may assume the role of a Network Operations Control Center (NOCC), which controls the access of the STs to the ASCMA telecommunication network 122, and also provides element management functions and control of the address resolution and resource management functionality. The satellite 112, in an example, operates as a packet switch (for example at a data link layer) that provides direct unicast and multicast communication among the STs provide connectivity to the user devices 120, respectively. According to one example of the present disclosure, the system 102 may have a fully meshed architecture, whereby the ST(s) 114 may directly communicate.

The system 102 in which the satellite terminals 114 are deployed, particularly a satellite system, incompatibility problems may arise if different “generations” of terminals exist, in which one ST employs older hardware and/or software technologies than the other. For newer, highly capable terminals to communicate with older (typically) less capable terminals, an exchange of information regarding the capabilities among the communicating terminals is needed. Specifically, the common air interface needs to support a discovery of capabilities profile (or context information) of the satellite terminal 114. These capabilities may include encryption scheme, compression scheme, Segmentation and Reassembly (SAR) scheme, Automatic Repeat Request (ARQ) scheme, Quality-of-Service (QoS) parameters, power levels, modulation and coding schemes, power control algorithms, and link adaptation capabilities.

Under a conventional approach, terminal profile may be readily exchanged over a network with a star topology where no peer-to-peer communication exists. For example, in the General Packet Radio Service (GPRS)/Universal Mobile Telecommunications System (UMTS) family of protocols, such capabilities profiles include a Packet Data Protocol (PDP) context and a mobility management context. In an example of the present disclosure, the concepts of PDP context and mobility management context are combined, and the term packet data protocol (PDP) context is used in general to refer to terminal capabilities. It is recognized that these terminals may be mobile as well as non-mobile. In an example, this PDP context, for example, which can provide information about the encryption algorithm, compression algorithm, modes of data link layer communication, and physical layer transfer capabilities is combined by the transmit ST 114 with the Quality of Service (QoS) of a pending data flow to determine a packet transfer context to use in transmission of the flow. If a PDP context has been previously established, then the sending ST may autonomously create the packet transfer context, which both satisfies the QoS of the data flow and is compatible with the receive ST 114 capabilities.

The exchange of terminal profile may be executed over a meshed network, in a peer-to-peer manner. The ST(s) 114 support the use of a negotiation procedure to determine the optimal configuration for transmission and reception of data. If a protocol implements control procedures or options in newer versions (For example flow-control/rate-control), older protocol versions are able to detect the initiation as a new unsupported procedure and report the same to the peer with minimal disruption in the flow of traffic.

The ST-ST protocol may account for that even for peers of the same version, some capabilities may not necessarily be always supported due to local temporal processing/memory/congestion-related constraints. Additionally, the ST-ST protocol design provides for rapid developments in data communication technology.

Incompatibility between two STs is detected by the terminal that originates the traffic. Thus, potential misconfigurations or software incompatibilities may at least be identified, without requiring communication at the service level of the more capable ST. For example, one of the STs may need to be reconfigured in order to communicate with compression disabled in order to allow communication with an ST that does not support compression. It is noted that the capability is not necessarily a function of solely configuration or software compatibility, however, may also be a function of current traffic load.

For each ST, there exist some configuration information, including network configuration, Network Service Provider (NSP) configuration, software configuration, and user configuration, as indicated by the NOCC. These configurations relate to the features that the ST supports and offers to the user and have a direct bearing on the transmission and reception capabilities.

To facilitate the flow of data from one peer ST to another ST of possibly different generations equipped with different capabilities, a packet transfer context is employed. Such a common feature set depends on the PDP contexts of the two STs; further, this common feature set may also depend on the QoS of the flow, as well as the loading and status of the two STs at that point of time. In an example, the packet transfer context is unidirectional and valid mainly for the transmit ST to send packets to the specified receive ST; thus, the packet transfer context may be unique to a given pair of STs.

In an example, the system 102 may include a transmitter node 126 with a plurality of source endpoints associated with the ASCMA telecommunication network 122. Each of the plurality of source endpoints includes the encoder unit 128. The system 102 may cause the encoder unit 128 to generate a set of low-rate Low-Density Parity Check (LDPC) codeword bits corresponding to a set of information bits associated with each of the plurality of source endpoints. For example, the codeword bits refer to a sequence of binary digits used in error-correcting codes to ensure the reliable transmission of data in communication systems. A codeword is composed of two parts: the message bits, which represent the original information, and parity bits, which are additional redundant bits generated using a mathematical encoding scheme. These parity bits enable the detection and correction of errors introduced during transmission. The total length of the codeword is the sum of the message and parity bits. For example, in a Hamming code, a 4-bit message could be encoded into a 7-bit codeword by adding 3 parity bits. Codeword bits are widely used in digital communication, data storage, and error-sensitive applications to maintain data integrity despite noise or interference in the system. The set of information bits refers to a collection or group of data, represented in binary (1s and 0s). These bits can encode various types of information, such as identifiers, configurations, metrics, or any data relevant to the context. The plurality of source endpoints may include, but not limited to, an User Equipment (UE), or the user devices 120 (such as smartphones, tablets, IoT devices, and the like), Base Stations (BS) (such as Fourth Generation/Fifth Generation (4G/5G) cellular towers, small cells, and the like), relay nodes (such as wireless repeaters, signal boosters, and the like), core network equipment (such as routers, gateways, Mobile Switching Centers (MSC), and the like), server infrastructure (such as data centers, cloud servers, and the like), end-user devices (such as laptops, desktops, smart Televisions (TVs), and the like), and the like.

In the ASCMA telecommunication network 122, a plurality of users (not shown) associated with the user devices 120 may transmit data concurrently over a shared frequency band without requiring synchronized codeword boundaries. This method enhances the efficiency of spectrum utilization by mitigating multi-user interference. For example, consider three users—User A, User B, and User C—each transmitting a distinct set of information bits on the same frequency band. In traditional SCMA systems, these users would need to align their codeword boundaries precisely, resulting in simultaneous start and stop times. Such synchronization may lead to significant interference, as the transmissions would overlap entirely.

Conversely, in the ASCMA telecommunication network 122, users transmit asynchronously, with no need for aligned codeword boundaries. Codeword boundaries define the start and end points of a codeword in a communication system, marking where a block of encoded data begins and ends within a transmission. In traditional synchronous systems, these boundaries must align across all users, ensuring that transmissions start and stop simultaneously to avoid interference. Misalignment can lead to overlapping data, complicating the decoding process. However, in asynchronous systems like ASCMA, codeword boundaries do not need to align, allowing users to transmit at different times. This flexibility reduces the need for strict timing coordination and helps manage interference more effectively, enabling the receiver to decode overlapping transmissions by leveraging variations in interference levels across the codeword.

For example, User A may initiate transmission at time T0, User B at T1, and User C at T2, leading to staggered transmissions. Due to the asynchrony, the interference levels across the codewords vary; some sections may experience substantial interference, while others remain relatively unaffected. This variability allows the decoder at the receiver to exploit the cleaner segments of the codewords to assist in accurately decoding the more heavily interfered portions. This asynchronous approach is particularly advantageous in dynamic environments where users exhibit varying transmission times, such as in mobile networks or IoT systems, enabling more robust and reliable communication while supporting a higher density of users.

In an example, the system 102 may cause the encoder unit 128 to aggregate the generated set of low-rate LDPC codeword bits with a plurality of replication of the set of information bits to generate an aggregated sequence of codeword bits. Further, the system 102 may include the modulator unit 130 communicatively coupled to the encoder unit 128. The system 102 may cause the modulator unit 130 to modulate the aggregated sequence of the codeword bits into a waveform for transmission over a shared spectrum access channel. Further, the system 102 may include the transmitter unit 132 communicatively coupled to the modulator unit 130. Additionally, the system 102 may cause the transmitter unit 132 to transmit the modulated waveform to a receiver node, over the shared spectrum access channel, by using asynchronous codeword boundaries.

In an example, the receiver node 104 includes the gateway 110 associated with a plurality of destination endpoints in the ASCMA telecommunication network. The destination endpoints include, but not limited to, devices, systems, or infrastructure that receive or process data originating from the source endpoints. These may include network servers and data centers, such as cloud servers or physical data centers, which handle incoming data for processing, storage, or further transmission. Additionally, core network components such as routers, gateways, and Mobile Switching Centers (MSC) play a role in managing and directing data within the network. End-user devices such as laptops, desktops, and smart TVs also act as destination endpoints, receiving data for consumption or interaction. Communication nodes, including base stations, relay nodes, and other infrastructure elements, may serve as either intermediate or final destinations in the communication process. Furthermore, connected IoT platforms and devices form part of the destination endpoints, especially in broader Internet of Things (IoT) ecosystems.

In an example, the gateway 110 may include the receiver unit 124 causing to receive the modulated waveform from the transmitter unit 132 associated with the transmitter node 126. The received waveform may be a noise corrupted version of the transmitted waveform. Further, the gateway 110 may include the decoder unit 106 associated with the receiver unit 124. The system 102 may cause the decoder unit 106 to decode the set of information bits using a soft-input and a soft-output decoding technique, based on receiving the modulated waveform. In one example, decoding may also be performed by mapping the set of information bits to a pre-defined set of low-rate LPDC codeword bits.

The soft-input and soft-output decoding techniques are crucial concepts in error-correction coding, particularly in communication systems where noise and interference can corrupt transmitted data. Both techniques are used in the context of decoding received signals, but they differ in how they handle the input and output of the decoding process. The soft-input decoding may refer to a decoding process where the decoder unit 106 may receive not just the hard, binary decision (0 or 1) of each bit but also additional information about the confidence or probability of each bit being a 0 or 1. This additional information may typically be represented as a likelihood ratio or a probability metric that indicates how certain the receiver is about each bit's value. By using this "soft" information, the decoder can make more informed decisions, leading to better error-correction performance, especially in noisy environments.

The soft-output decoding may take this concept further by not mainly using soft-input information but also producing soft-output information. Instead of simply outputting a hard decision (0 or 1) for each bit, the decoder provides a probability or confidence level for each bit in the decoded output. This soft-output information can then be used by subsequent stages in the communication system, such as iterative decoders or decision-making processes, to further improve the accuracy and reliability of the decoded data. Together, soft-input, and soft-output decoding techniques enable more sophisticated and accurate error correction, particularly in systems such as Turbo codes or LDPC codes, where iterative decoding is common. By utilizing probabilistic information throughout the decoding process, these techniques help achieve better performance in terms of reducing the Bit Error Rate (BER) and approaching theoretical limits of communication efficiency.

In an example, the gateway 110 may include the Multi-User Interference (MUI) estimator unit 108 communicatively coupled to the decoder unit 106. The system 102 may cause the MUI estimator unit 108 to mitigate the plurality of interference levels in the received waveform, using a Multi-User Interference (MUI) cancellation technique. The MUI estimator unit uses an elementary symbol estimator (ESE) technique to approximate plurality of modulated waveform of the source endpoints as a Gaussian process. Gaussian process approximation leads to a computationally simple estimation algorithm without compromising the estimation accuracy especially when the number of modulated waveforms is high. When integrated with LDPC codes, known for the superior error-correcting capabilities due to their sparse parity-check matrices, ESE improves the precision of symbol estimation without excessively increasing computation complexity. This, in turn, enhances the performance of the LDPC decoding algorithms, ensuring high data integrity and reliability even under challenging conditions. Thus, ESE achieves effective multi-user communication and robust error correction in ASCMA systems.

In an example, the system 102 may cause the decoder unit 106 to generate the set of information bits associated with each of the plurality of source endpoints, based on mitigating the plurality of interference levels in the received waveform. Further, the system 102 may optimize a structure associated with the low-rate LDPC code, using an Extrinsic Information Transfer (EXIT) chart technique. The EXIT charts may provide a graphical representation of how extrinsic information is transferred between the LDPC decoder and the MUI estimator unit during iterative decoding. By analyzing these charts, the system 102 may adjust the LDPC code structure to better handle the identified interference and SNR conditions, enhancing the error-correcting performance of the code. This results in improved reliability and efficiency of data transmission despite the challenging communication environment.

Figure 2:
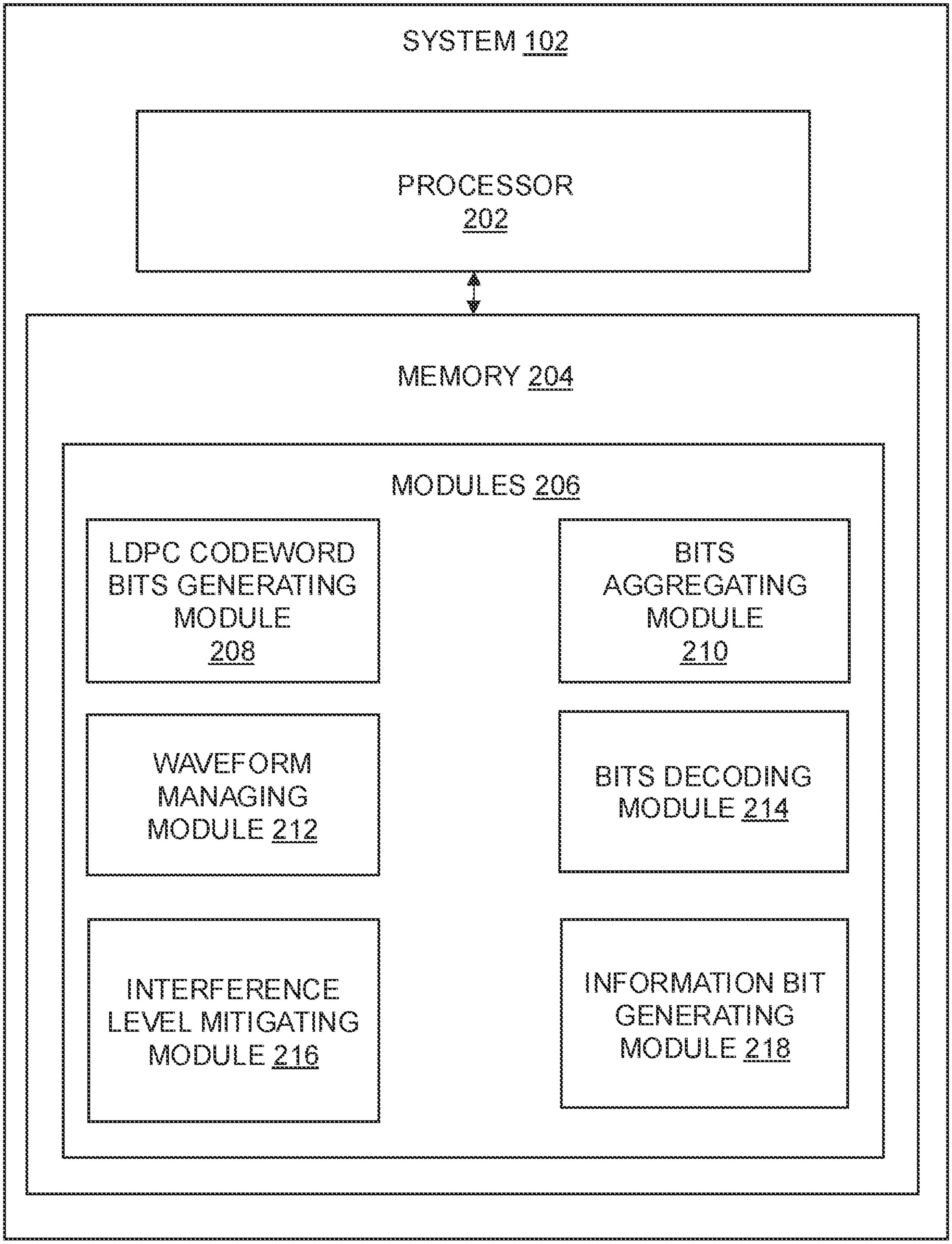
FIG. 2 illustrates a block diagram representation of a proposed system, such as those shown in FIG. 1, capable of generating Low-Density Parity-Check (LDPC) codes in an Asynchronous Scrambled Coded Multiple Access (ASCMA) telecommunication network, according to an example.

FIG. 2 illustrates a block diagram representation of a proposed system, such as those shown in FIG. 1, capable of generating the Low-Density Parity-Check (LDPC) codes in the Asynchronous Scrambled Coded Multiple Access (ASCMA) telecommunication network 122, according to an example. The system 102 may also function as a computer-implemented system. The system 102 may include one or more processors 202, and a memory 204. The memory 204 includes a plurality of modules 206 in the form of programmable instructions executable by the one or more processors 202. The memory 204 may include processor-executable instructions, which on execution, cause the processor 202 to perform one or more operations described herein.

Further, the plurality of modules 206 may include a LDPC codeword bits generating module 208, a bits aggregating module 210, a waveform managing module 212, a bits decoding module 214, an interference level mitigating module 216, and an information bit generating module 218.

The memory 204 may be a non-transitory volatile memory and a non-volatile memory. The memory 204 may be coupled to communicate with the one or more hardware processors 202, such as being a computer-readable storage medium. The one or more hardware processors 202 may execute machine-readable instructions and/or source code stored in the memory 204. A variety of machine-readable instructions may be stored in and accessed from the memory 204. The memory 204 may include any suitable elements for storing data and machine-readable instructions, such as read-only memory, random access memory, erasable programmable read-only memory, electrically erasable programmable read-only memory, a hard drive, a removable media drive for handling compact disks, digital video disks, diskettes, magnetic tape cartridges, memory cards, and the like. In the present disclosure, the memory 204 may include the modules 206 stored in the form of machine-readable instructions on any of the above-mentioned storage media and may be in communication with and executed by the one or more processors 202.

In an example, the LDPC codeword bits generating module 208 may be configured to generate a set of low-rate Low-Density Parity Check (LDPC) codeword bits corresponding to a set of information bits associated with each of a plurality of source endpoints. In an example, the bits aggregating module 210 may be configured to aggregate the generated set of low-rate LDPC codeword bits with a plurality of replication of the set of information bits to generate an aggregated sequence of codeword bits. In an example, the waveform managing module 212 may be configured to modulate the aggregated sequence of the codeword bits into a waveform for transmission over a shared spectrum access channel. In an example, the waveform managing module 212 may be configured to transmit the modulated waveform to the receiver node 104, over the shared spectrum access channel, by using asynchronous codeword boundaries. In an example, the waveform managing module 212 may be configured to receive the modulated waveform from a transmitter unit associated with the transmitter node. The received waveform is a noise corrupted version of the transmitted waveform.

In an example, the bits decoding module 214 may be configured to decode the set of information bits using a soft-input and a soft-output decoding technique, based on receiving the modulated waveform.

In an example, the interference level mitigating module 216 may be configured to mitigate the receiver node, the plurality of interference levels in the received waveform, using a Multi-User Interference (MUI) cancellation technique. Further, the information bit generating module 218 may be configured to generate the set of information bits associated with each of the plurality of source endpoints, based on mitigating the plurality of interference levels in the received waveform.

In an example, the processor 202 may encode the set of information bits from each of the plurality of source endpoints using respective Forward Error Correction (FEC) encoders. Furthermore, the processor 202 may scramble, via each of plurality of scramblers, the encoded set of information bits from each of the plurality of source endpoints. Furthermore, the processor 202 may modulate, via each of plurality of scramblers and the modulator unit, the scrambled set of encoded bits.

In another example, the processor 202 may optimize a structure associated with the low-rate LDPC code, using an Extrinsic Information Transfer (EXIT) chart technique. The ESE technique may be used to evaluate plurality of modulated waveform of the source endpoints as a Gaussian process.

Each of these modules when executed by the processor 202 perform one or more functionalities described in the context of the system 102. The one or more processors 202, as used herein, means any type of computational circuit, such as, but not limited to, a microprocessor unit, microcontroller, complex instruction set computing microprocessor unit, reduced instruction set computing microprocessor unit, very long instruction word microprocessor unit, explicitly parallel instruction computing microprocessor unit, graphics processing unit, digital signal processing unit, or any other type of processing circuit. The one or more processors 202 may also include embedded controllers, such as generic or programmable logic devices or arrays, application-specific integrated circuits, single-chip computers, and the like.

Figure 3:
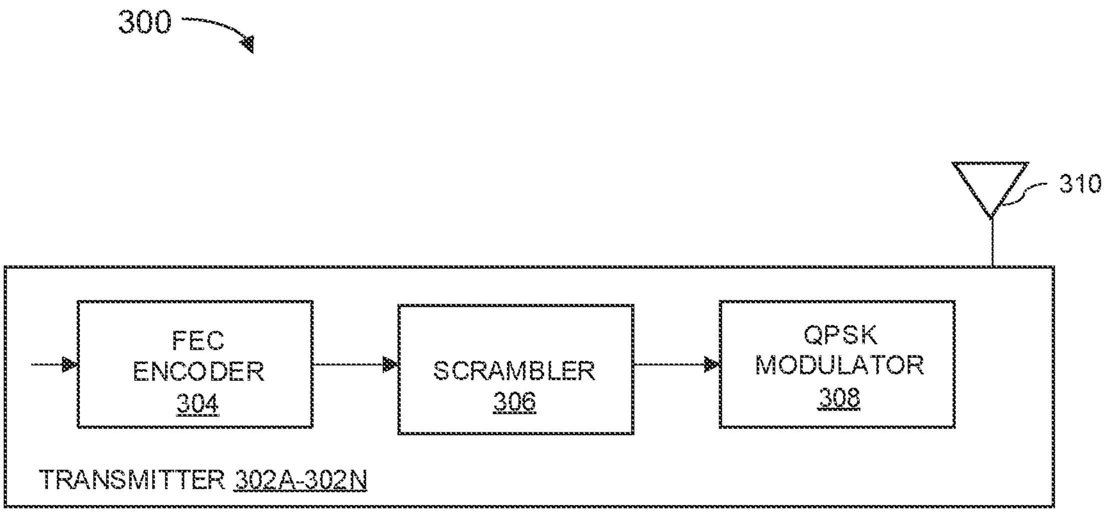
FIG. 3 illustrates a block diagram representation of a transmitter node capable of encoding Low-Density Parity-Check (LDPC) codes in an Asynchronous Scrambled Coded Multiple Access (ASCMA) telecommunication network, according to an example.

FIG. 3 illustrates a block diagram representation of a transmitter node 300 capable of encoding Low-Density Parity-Check (LDPC) codes in the ASCMA telecommunication network 122, according to an example. The transmitter node 300 may include a plurality of transmitter 302A, 302B, . . . , 302N (individually referred to as the transmitter 302 and collectively referred to as the transmitters 302). The transmitter 302 may include a Forward Error Correction (FEC) encoder 304 that accepts input from an information source and outputs a coded stream of higher redundancy.

Essentially, the encoder FEC 304 generates signals from alphabet 'Y' to a channel scrambler 306, which scrambles the alphabet. That is, the channel scrambler 204 pseudo-randomizes the code symbols. The scrambled signals are provided to a Quadrature Phase Shift Keying (QPSK) modulator 308, which maps the encoded messages from the FEC encoder 304 to signal waveforms that are transmitted to a transmit antenna 310.

The antenna 310 emits these waveforms over the communication channel. Accordingly, the encoded messages are modulated and distributed to a transmit antenna 310. The transmissions from the transmit antenna 310 propagate to a receiver.

The Forward error correction (FEC) is required in terrestrial and satellite systems to provide high quality communication over a radio frequency (RF) propagation channel, which induces signal waveform and spectrum distortions, including signal attenuation (free space propagation loss) and multi-path induced fading. These impairments drive the design of the radio transmission and receiver equipment; exemplary design objectives include selecting modulation formats, error control schemes, demodulation and decoding techniques and hardware components that together provide an efficient balance between system performance and implementation complexity. Differences in propagation channel characteristics, such as between terrestrial and satellite communication channels, naturally result in significantly different system designs. Likewise, existing communication systems continue to evolve in order to satisfy increased system requirements for new higher rate or higher fidelity communication services.

Code rate is an important factor that has a significant effect on the error performance of the code. The choice of which code rate to operate, in turn, depends on the SNR of the environment in which the codes will be deployed. Conventionally, low SNR environments require the use of low code rates (i.e., more redundancy), whereas high SNR environments may enable the utilization of higher code rates. There is a continual challenge to devise codes that edge closer to the Shannon limit, while minimizing complexity.

When considering turbo codes and LDPC codes, irregular LDPC codes have been demonstrated to achieve superior performance over turbo codes for high code rates, whereas turbo codes have been demonstrated to be superior for lower code rates in low SNR environments. For very low codes such as 1/6 or lower, the coding industry has focused on classical turbo code design, which may, in essence, be improved. Because turbo codes have traditionally been designed to maximize the minimum Hamming weight of systematic codewords (where the information part of the codeword has a Hamming weight of two), it is recognized that further coding improvements may be made. At relatively high SNR, this approach yields good codes, because two codewords may be easily confused when their information part is differed by two bits, owing to the recursive nature of their constituent codes.

However, for very low SNR where low code rates are traditionally used, an investigation of the erroneous turbo code frames reveals that the number of errors in the information part, is in general, more than two. This observation suggests that by targeting minimum Hamming weight corresponding to information sequences with Hamming weight more than two, the performance of low code rates, in principle, may be enhanced. With improved design, low-rate turbo codes may approach the Sham-on limit more closely, resulting in a plurality of advantages for communication systems such as extended battery lifetime within cellular networks, lower transmit power within satellite communication and broadcasting systems, interference mitigation, and the like.

Figure 4:
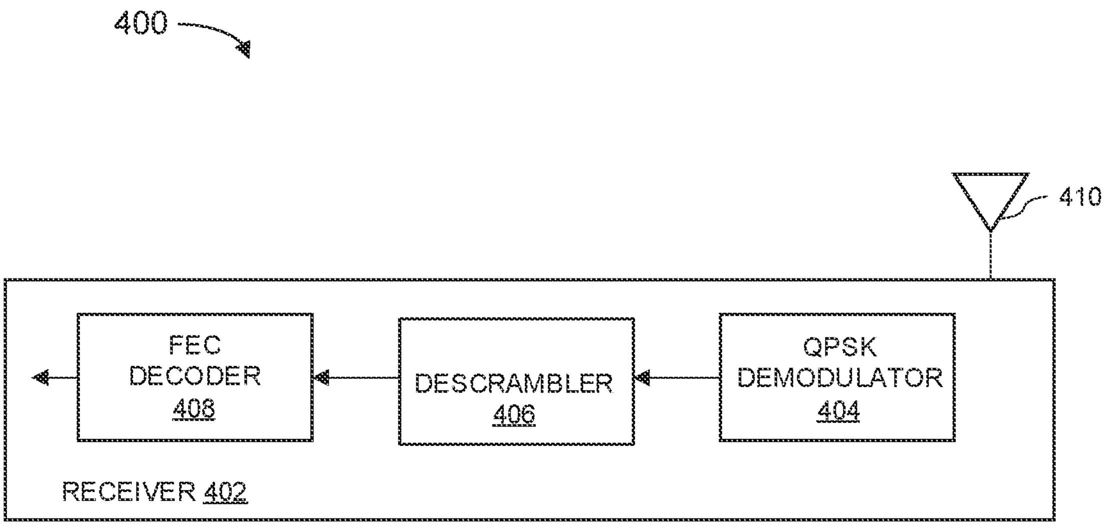
FIG. 4 illustrates a block diagram representation of a receiver node capable of decoding Low-Density Parity-Check (LDPC) codes in an Asynchronous Scrambled Coded Multiple Access (ASCMA) telecommunication network, according to an example.

FIG. 4 illustrates a block diagram representation of a receiver node 400 capable of decoding the Low-Density Parity-Check (LDPC) codes in the ASCMA telecommunication network 122, according to an example. The receiving node 400, may include a receiver 402, and the receiver 402 may include an antenna 410 that receives the waveforms emitted over the channel. The receiver 402 includes a QPSK demodulator 404 to perform demodulation of the received signals. After demodulation, the received signals are forwarded to a channel descrambler 406 to unscramble the symbols. Further, the receiver 402 may include a FEC decoder 408 to reconstruct the original source messages.

It is contemplated that the above a transmitter 302 and a receiver 402 may be deployed in within a single wireless terminal, in which case a common antenna system may be shared. The wireless terminal may, for example, be configured to operate within a satellite communication, a cellular system, a wireless local area network (WLAN), and the like.

Figure 5:
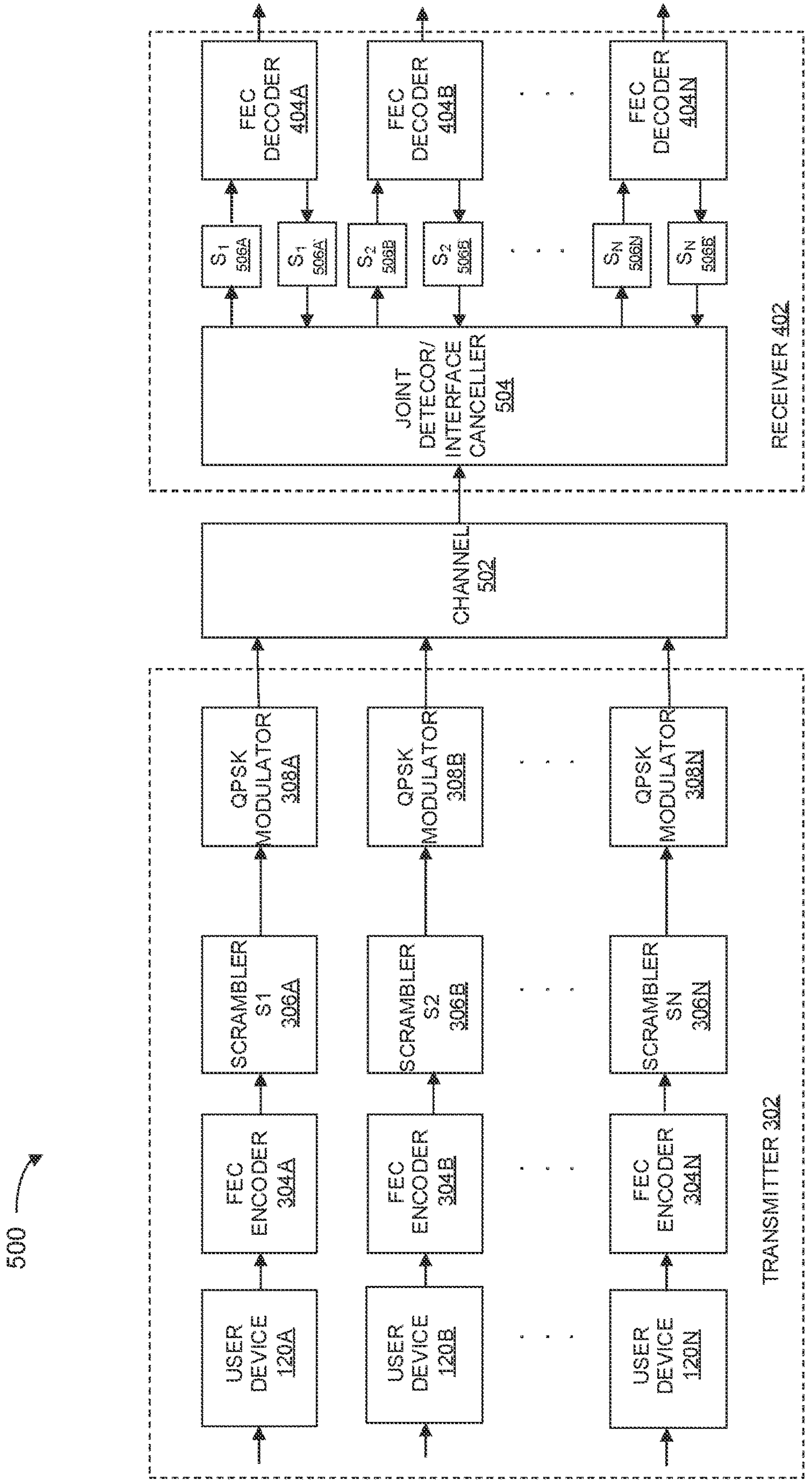
FIG. 5 illustrates a block diagram representation of a communication system with a plurality of transmitters in an Asynchronous Scrambled Coded Multiple Access (ASCMA) scheme implementing low-rate codes, according to an example.

FIG. 5 illustrates a block diagram representation of a communication system 500 with a plurality of transmitters in a the ASCMA scheme implementing low-rate codes, according to an example. The system 102 may support multiple terminals such as a plurality of user devices 120A, 120B, 120N (collectively referred to as the user devices 120) communicatively coupled to respective FEC encoders 304A, 304B, . . . , 304N (collectively referred to as the FEC encoders 304). Further, the FEC encoders 304 may be communicatively coupled to respective scramblers 306A, 306B, . . . , 306N (collectively referred to as the scramblers 306).

In an example, the system 102 provides a multiple access scheme, such as the ASCMA, which achieves good performance compared to SCMA (as the number of users that share the same channel increases).

Each of the FEC encoders 304 utilizes the same turbo codes. The turbo encoded sequences are then fed to the respective user-specific scramblers 306. The scrambled sequences are then transmitted over channel 502 to the receiver 402, which includes a joint detector/interference canceller unit 504 that interacts with the FEC decoders 408 to iteratively produce an estimate of the received codewords. With each iteration, the FEC decoders 408 produces a better estimate to the joint detector/interference canceller 504 for achieving better cancellation. The information exchanged between FEC decoders 408 and the joint detector/interference canceller 504 may be scrambled or descrambled via the scramblers 306 or de-scramblers 406, respectively. Once appropriate estimates of the decoded sequences are produced, the estimates are output from the FEC decoders 408.

Unlike, the conventional SCMA systems, the joint detection/interference canceller 504 may not require all the signals accessing the same spectrum at the same time to be of equal power. In fact, the performance is better when the signals are of different power level. Thus, no tight power controls are needed. Also due to joint detection/interference cancellation, the system 102 provides a scheme that is much more robust against Rician fading, which makes it particularly more attractive for small mobile terminals experiencing Rician multipath fading.

Therefore, the system 102, as a ASCMA system using a low-rate FEC coding, requires less power to transmit data at the same speed vis-à-vis a SCMA system. In one example, the system 102 may be operated in a random-access manner and does not require reservation of time slots, which minimize the delay to one satellite round trip. Additionally, the system 102, may not require tight power control, minimizing the coordination needed between transmitter 302 and receiver 402. By way of example, potential applications may include mobile or aeronautical terminals, and other applications such as to enable Direct Broadcast Satellite (DBS) operators to provide return link over satellite via a commercial satellite using existing antenna systems.

Each user encodes respective data with, for example, a rate 1/n FEC, where 'n' may be an integer larger than 3. The coded bits are then scrambled with a unique scrambling sequence and transmitted. The number of unique sequences is virtually unlimited with common sequence generators, such as the gold sequences. The same generator may generate all the sequences, which are differentiated by the initial vector. It is noted that other low rates may be utilized, m/n (for example less than 1/3). The low-rate comprises m/n rate of the LDPC codeword bits to be aggregated with the plurality of replication of the set of information bits.

The scrambling sequence may be generated by selecting a pseudorandom number sequence (such as a gold sequence) whose period is greater than the code block. On the receiver side, the respective user uses the corresponding de-scrambler and a rate 1/n decoder to retrieve respective data. The signals are modulated by the same type of modulation, such as QPSK, of the same bandwidth, centered at the same frequency and transmitted at the same time (similar to SCMA). Typically, for receivers located in a hub of a star-shaped network, the antennas may be shared.

The EXIT chart, a tool that helps visualize the exchange of mutual information in an iterative system under the assumption that the inter-leaver length is sufficiently large, is helpful in the design of the FEC codes. The mutual information between the FEC encoded bit 'X' and respective soft apriori or extrinsic information 'S' may be computed as shown in equation 1 below:

$$I(S; X) = 1 - E\left(\log_2\left(1 + e^{-XS}\right)\right) \quad \text{Equation 1}$$

In the above equation 1, the variable E(•) is an expectation operation. Currently, the ASCMA may be deployed with a mean Poisson arrival rate of approximately $\lambda=9$. The system has this limit on '$\lambda$' because of the deteriorating error performance with higher '$\lambda$.' The target Frame Error Rate (FER) may be about $FER=5\times10^{-3}$. It would be desirable to reduce per user 'Es' or no requirements around or above this target '$\lambda$.'

Figure 6:
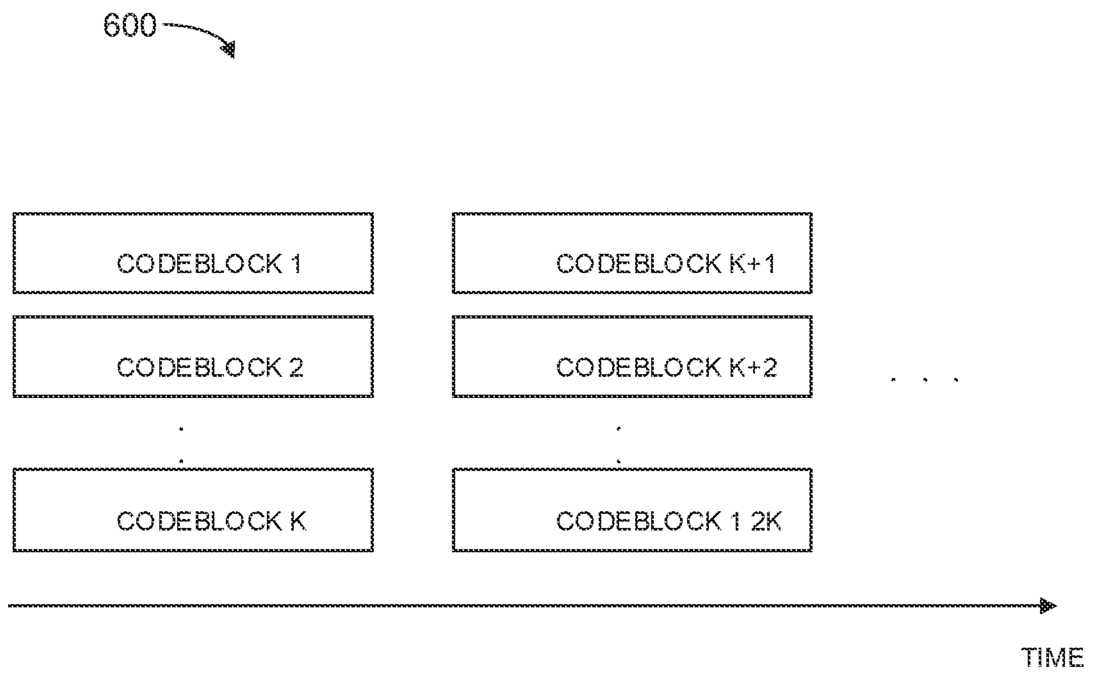
FIG. 6 illustrates a block diagram representation of a Scrambled Coded Multiple Access (SCMA) transmitted codewords, according to an example.
Figure 7:
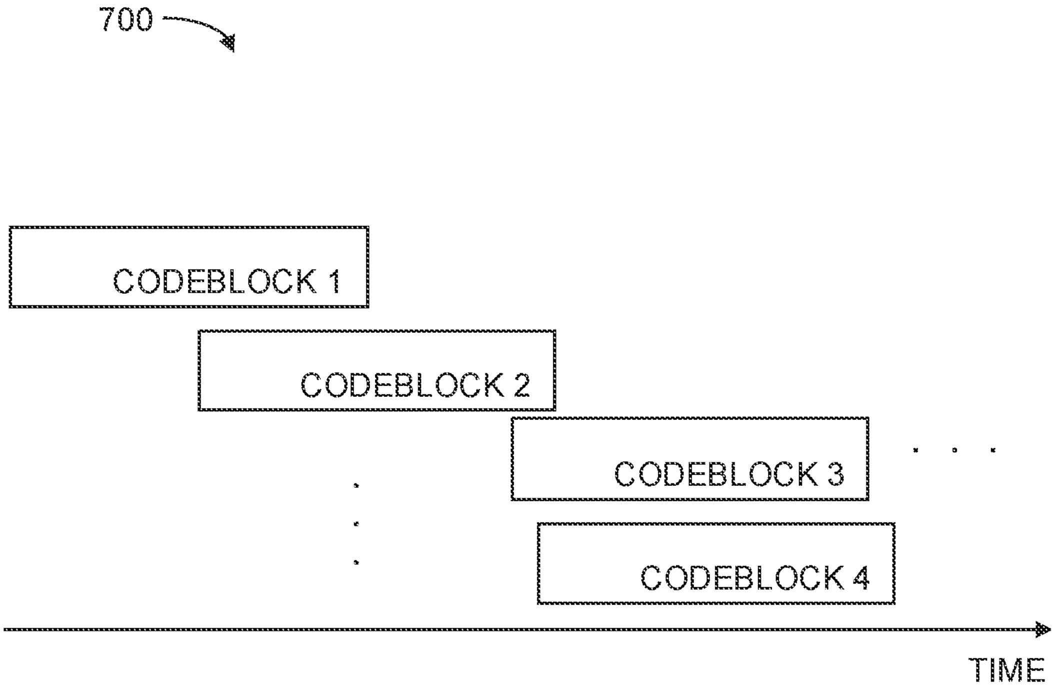
FIG. 7 illustrates a block diagram representation of an Asynchronous Scrambled Coded Multiple Access (ASCMA) transmitted codewords, according to an example.

FIG. 6 illustrates a block diagram representation of a Scrambled Coded Multiple Access (SCMA) transmitted codewords 600, according to an example. Further, FIG. 7 illustrates a block diagram representation of an Asynchronous Scrambled Coded Multiple Access (ASCMA) transmitted codewords 700, according to an example. In ASCMA a level of interference varies across the codeword which helps the receiver performance.

In the SCMA, the transmitted codewords 600 are aligned in time, causing 100% multi-user interference throughout the entire duration of the codeword. This implies that every part of a transmitted codeword overlaps completely with the corresponding parts of codewords from other users, leading to significant interference. As a result, the receiver must contend with a high level of interference across the entire codeword, and in turn challenging to accurately decode the intended signal.

In contrast, the ASCMA introduces a level of asynchrony by misaligning the transmitted codewords 700. This misalignment causes the level of interference to vary across different parts of the codeword. Some segments of the codeword experience less interference, creating "cleaner" regions that are less affected by multi-user interference. These cleaner regions assist in decoding the heavily interfered parts, improving the overall performance of the receiver. FIG. 6 depict a fully aligned codewords 600 in the SCMA, leading to complete interference, while FIG. 7 depict a staggered codewords 700 in the ASCMA, which results in varying levels of interference that enhance decoding performance.

Figure 8A:
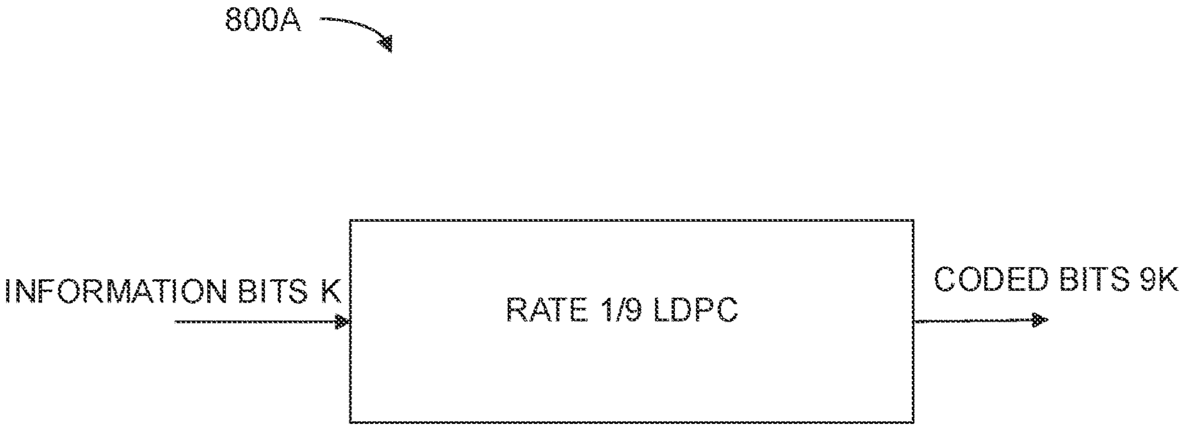
FIGS. 8A and 8B illustrate block diagram representations of a comparison of current Low-Density Parity-Check (LDPC) codes and the proposed LDPC codes in an Asynchronous Scrambled Coded Multiple Access (ASCMA) telecommunication network, according to an example.
Figure 8B:
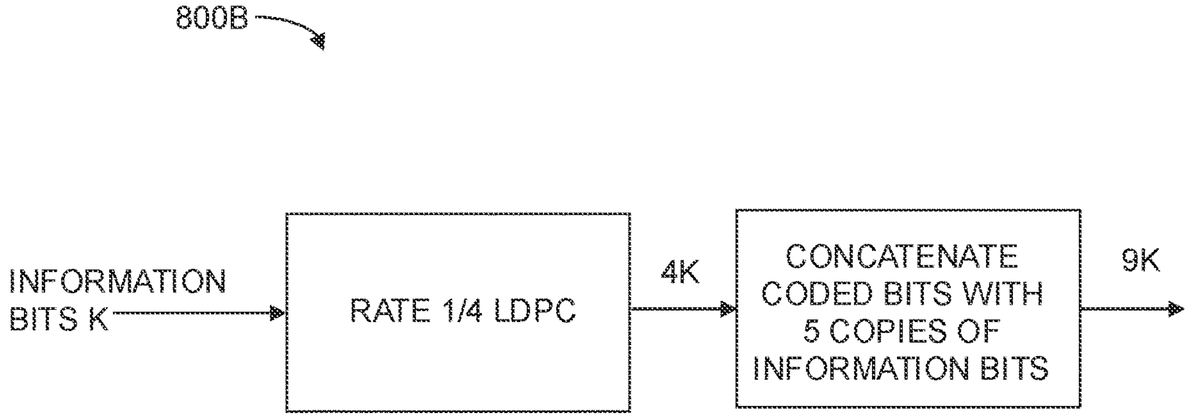

FIGS. 8A and 8B illustrate block diagram representations of a comparison of current Low-Density Parity-Check (LDPC) codes 800A and the proposed LDPC codes 800B in the ASCMA telecommunication network 122, according to an example. In an example, the difference between the proposed LDPC codes 800B and the existing/current (SCMA or ASCMA) LDPC code 800A may be highlighted. The proposed "rate 1/9" code includes an actual rate "1/4" code concatenated with, for example, five copies of the information bits. Besides this difference, the degree distributions of the two LDPC codes are also different.

Figure 9A:
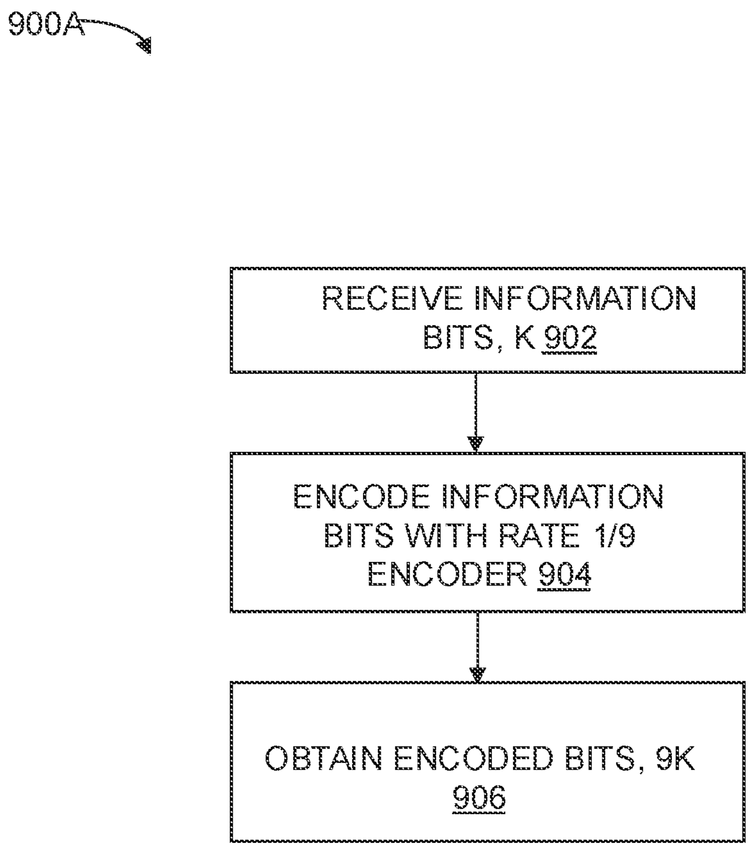
FIGS. 9A and 9B illustrate flow diagram representations of a method for generating current Low-Density Parity-Check (LDPC) codes and a method for generating proposed LDPC codes in an Asynchronous Scrambled Coded Multiple Access (ASCMA) telecommunication network, according to an example.
Figure 9B:
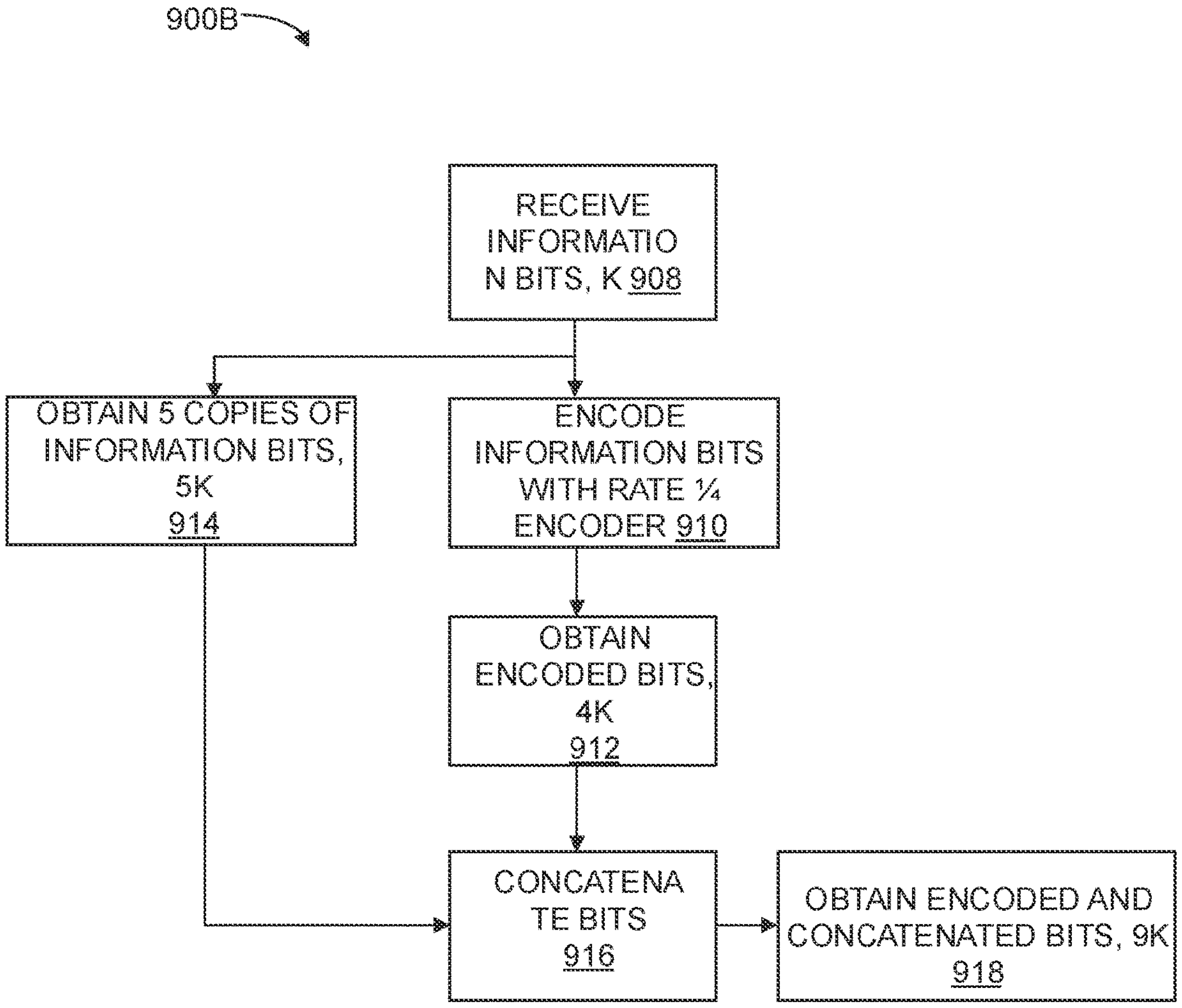

FIGS. 9A and 9B illustrate flow diagram representations of a method 900A for generating current Low-Density Parity-Check (LDPC) codes and a method 900B for generating the proposed LDPC codes in an Asynchronous Scrambled Coded Multiple Access (ASCMA) telecommunication network, according to an example. The current Low-Density Parity-Check (LDPC) codes are generated using method steps 900A include:

At step 902, the method 900A includes receiving, by the processor 202, information bits of, for example, K bits.

At step 904, the method 900A includes encoding, by the processor 202, the information bits with 1/9 rate encoder.

At step 906, the method 900A includes encoding, by the processor 202, the information bits for example 9K bits.

The proposed Low-Density Parity-Check (LDPC) codes in the ASCMA telecommunication network 122 are generated using the method steps 900B includes:

At step 908, the method 900B includes receiving, by the processor 202, information bits of, for example, K bits.

At step 910, the method 900B includes encoding, by the processor 202, the information bits with rate 1/4 encoder.

At step 912, the method 900B includes obtaining, by the processor 202, encoded bits (for example 4K).

At step 914, the method 900B includes obtaining, by the processor 202, at least 5 copies of the information bits (for example 5K).

At step 916, the method 900B includes concatenating, by the processor 202, the encoded bits of, for example 4k bits, with the obtained at least 5 copies of the information bits.

At step 918, the method 900B includes obtaining, by the processor 202, encoded and concatenated bits (for example 9K).

Figure 10A:
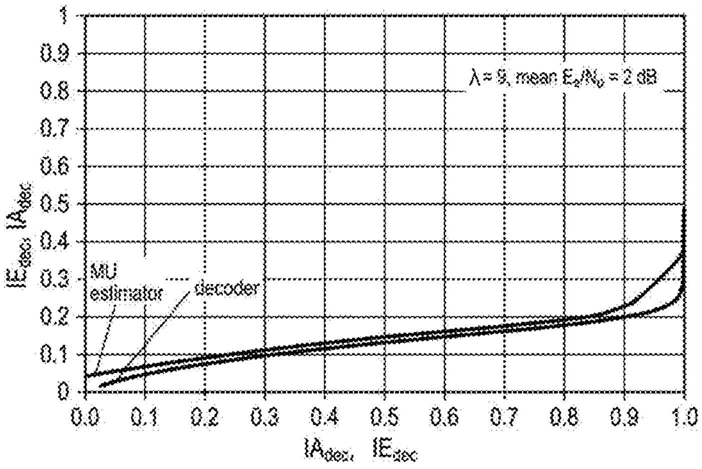
FIG. 10A illustrates a graph diagram representation of an example exit chart of a proposed Low-Density Parity-Check (LDPC) code with a multi-user interference estimator, according to an example.

FIG. 10A illustrates a graph diagram representation of an example exit chart 1000A of a proposed Low-Density Parity-Check (LDPC) code with a multi-user interference estimator, according to an example. For example, the exit chart 1000A may depict that, the soft-in/soft-out curve of the decoder is in good agreement with that of the multi-user interference estimator for the approximate operating points. The difference between the new LDPC code and the existing (A) SCMA LDPC code is highlighted. For example, new "rate 1/9" code consists of an actual rate '1/4' code concatenated with, for example, five '5' copies of the information bits. Besides this difference, the degree distributions of the two LDPC codes are also different as shown in Table 1 and 2.

TABLE 1

| Degree | Number of bit nodes |
|---|---|
| 2 | 5759 |
| 1 | 1 |

TABLE 2

| Degree | Number of bit nodes |
|---|---|
| 3 | 640 |
| 2 | 1919 |
| 1 | 1 |

Further, the performance of the ASCMA telecommunication network 122 by using the new and the legacy LDPC codes may be compared under the unrealistic assumption of 720 decoder iterations upper limit per frame. The system 102 first chooses the high number of iterations to compare the limiting capability of the two codes if the system 102 had infinite resources. The maximum number of 720 (=6×12×10) decoder iterations is obtained using 6 windows in a sliding window receiver arrangement, 12 multi-user interference estimation iterations per window, and 10 decoder iteration per multi-user interference estimation. At FER=$1\times10^{-3}$, compared to the legacy code, the new code requires about 1.5 dB less per user Es/No for $\lambda$=9, 1 dB less for $\lambda$=10, and 0.2 dB less for $\lambda$=11.

Figure 10B:
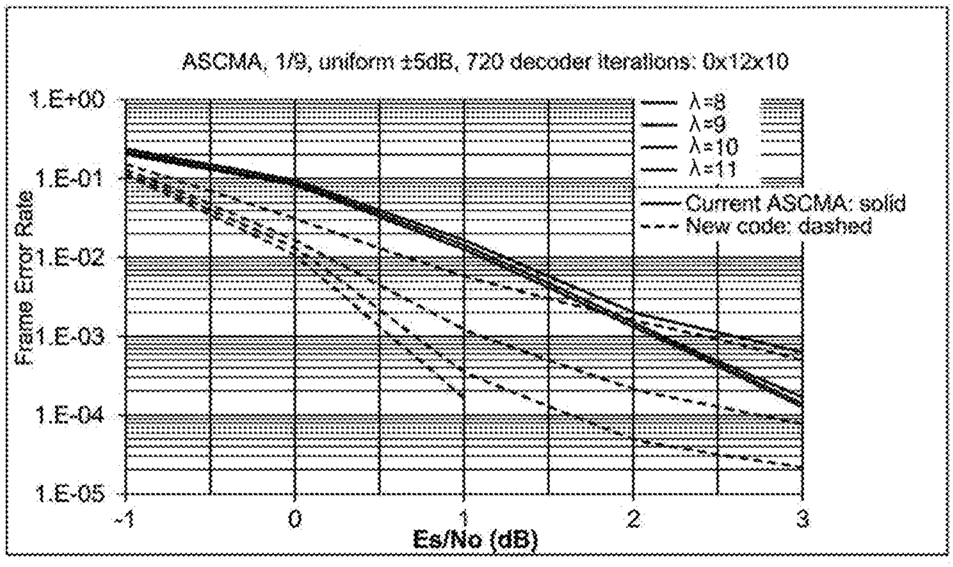
FIG. 10B illustrates a graph diagram representation of an example performance comparison graph of an Asynchronous Scrambled Coded Multiple Access (ASCMA) scheme based Low-Density Parity-Check (LDPC) codes with varying average number of simultaneous users, according to an example.

FIG. 10B illustrates a graph diagram representation of an example performance comparison graph 1000B of an Asynchronous Scrambled Coded Multiple Access (ASCMA) scheme based Low-Density Parity-Check (LDPC) codes with varying average number of simultaneous users, according to an example. The ASCMA performance comparison graph 1000B of the LDPC codes is for 720 maximum decoder iterations. The simulation results of more practical 72 (6×2×6) and 48 (6×2×4) decoder iterations, in addition to 720 are shown for the case of $\lambda$=11. As expected, the performance gap between the two codes widens as the number of decoder iterations get smaller to more practical values because the new code converges faster. The new code requires about 0.5 dB less with 72 iterations and 0.8 dB less with 48 iterations (compared to 0.2 dB less with 720 iterations.) In particular, the performance of the new code with 48 iterations looks very similar to the performance of the legacy code with 72 iterations. It should be noted that per decoder complexity of the new code may also be less than that of the legacy code due to decreased block size.

Figure 10C:
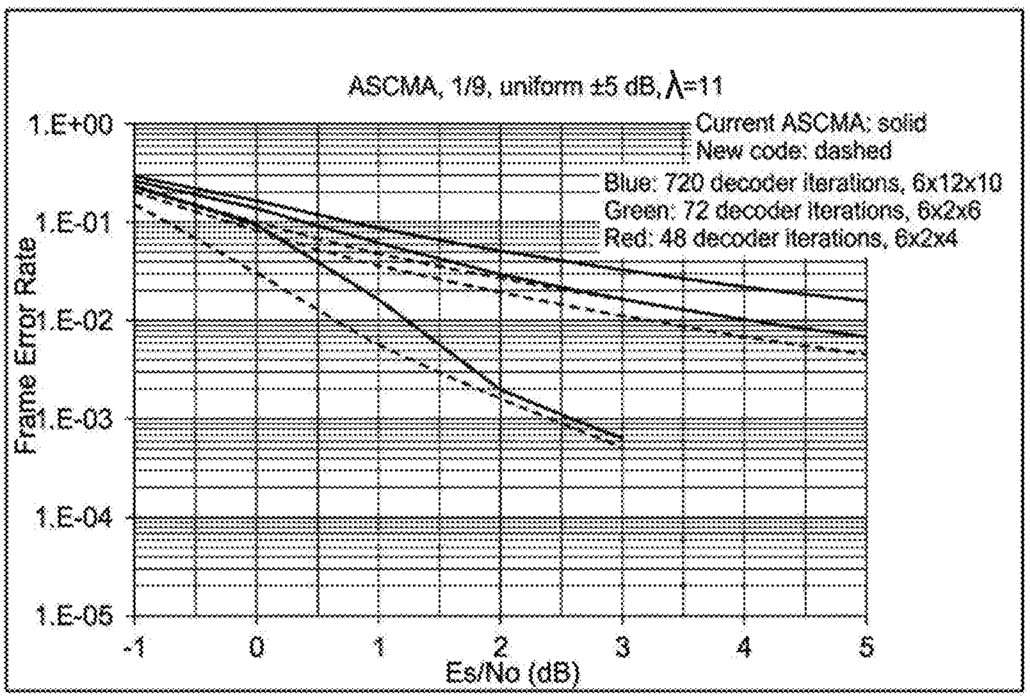
FIG. 10C illustrates a graph diagram representation of an example performance comparison graph of an Asynchronous Asynchronous Scrambled Coded Multiple Access (AS- CMA) Asynchronous Coded ASCMA) based LDPC codes with varying number of maximum decoder iterations, according to an example.

FIG. 10C illustrates a graph diagram representation of an example performance comparison graph 1000C of an Asynchronous Scrambled Coded Multiple Access (ASCMA) based LDPC codes with varying number of maximum decoder iterations, according to an example. The graph 1000C depicts the Frame Error Rate (FER) of an ASCMA system under various conditions. The x-axis represents the Es/No (signal-to-noise ratio), while the y-axis indicates the probability of a frame being received incorrectly. The system employs an ASCMA configuration with a 1/9 modulation scheme, uniform power allocation, and a maximum allowable amplitude variation of ±5 db. The parameter 'λ' (Poisson arrival rate) is set to 11. The graph 1000C compares the performance of the current ASCMA implementation (solid lines) with a new code (dashed lines). Varying decoder iteration counts, and code parameters include, for example, a line uses 720 decoder iterations with a 6×12×10 code.

As expected, the FER decreases as the Es/No increases for all configurations. This means that with a higher signal-to-noise ratio, the system 102 is less likely to make errors. Increasing the number of decoder iterations improves performance, as evident by the comparison between the blue (720 iterations) and green (72 iterations) lines. More iterations allow the decoder to refine its estimates and reduce errors. The specific code parameters (for example, 6×12×10) also influence performance. The proposed LDPC code (dashed lines) appears to offer slightly better performance than the current ASCMA implementation, particularly at lower Es/No values. Increasing decoder iterations is beneficial for reducing FER. The choice of code parameters can significantly affect the performance of the system 102.

Figure 10D:
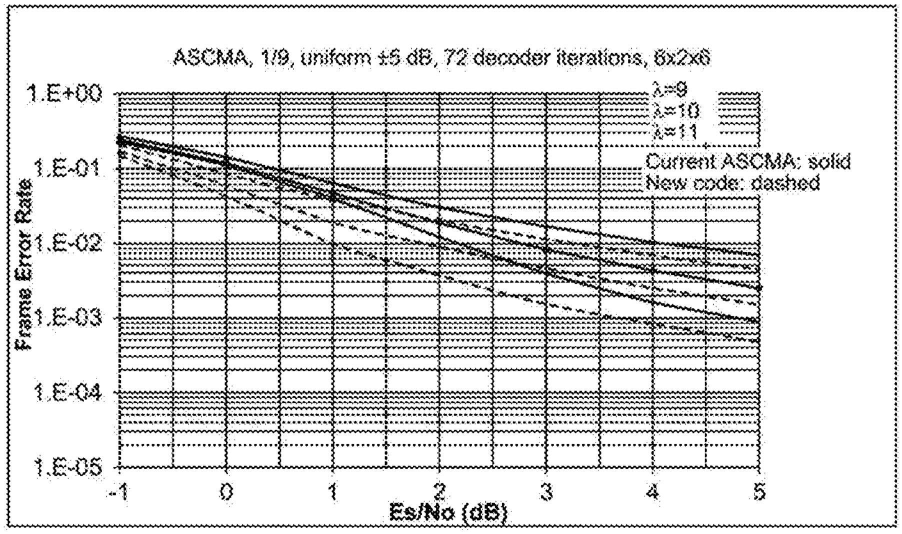
FIG. 10D illustrates a graph diagram representation of an example performance comparison graph of an Asynchronous Scrambled Coded Multiple Access (ASCMA) based LDPC codes with pre-defined number of decoder iterations and with varying average number of simultaneous users, according to an example.

FIG. 10D illustrates a graph diagram representation of an example performance comparison graph 1000D of the ASCMA based LDPC codes with pre-defined number of decoder iterations and with varying average number of simultaneous users, according to an example. The ASDMA performance comparison of the LDPC codes is, for example, 72 maximum decoder iterations. The ASCMA performance comparison using the two codes for 6×2×6 iteration arrangement for λ=9 and 10, in addition to λ=11. Performance improvement due to the new code is about 1.2 dB (λ=9), 1.0 dB (λ=10), and 0.5 dB (λ=11).

Figure 11:
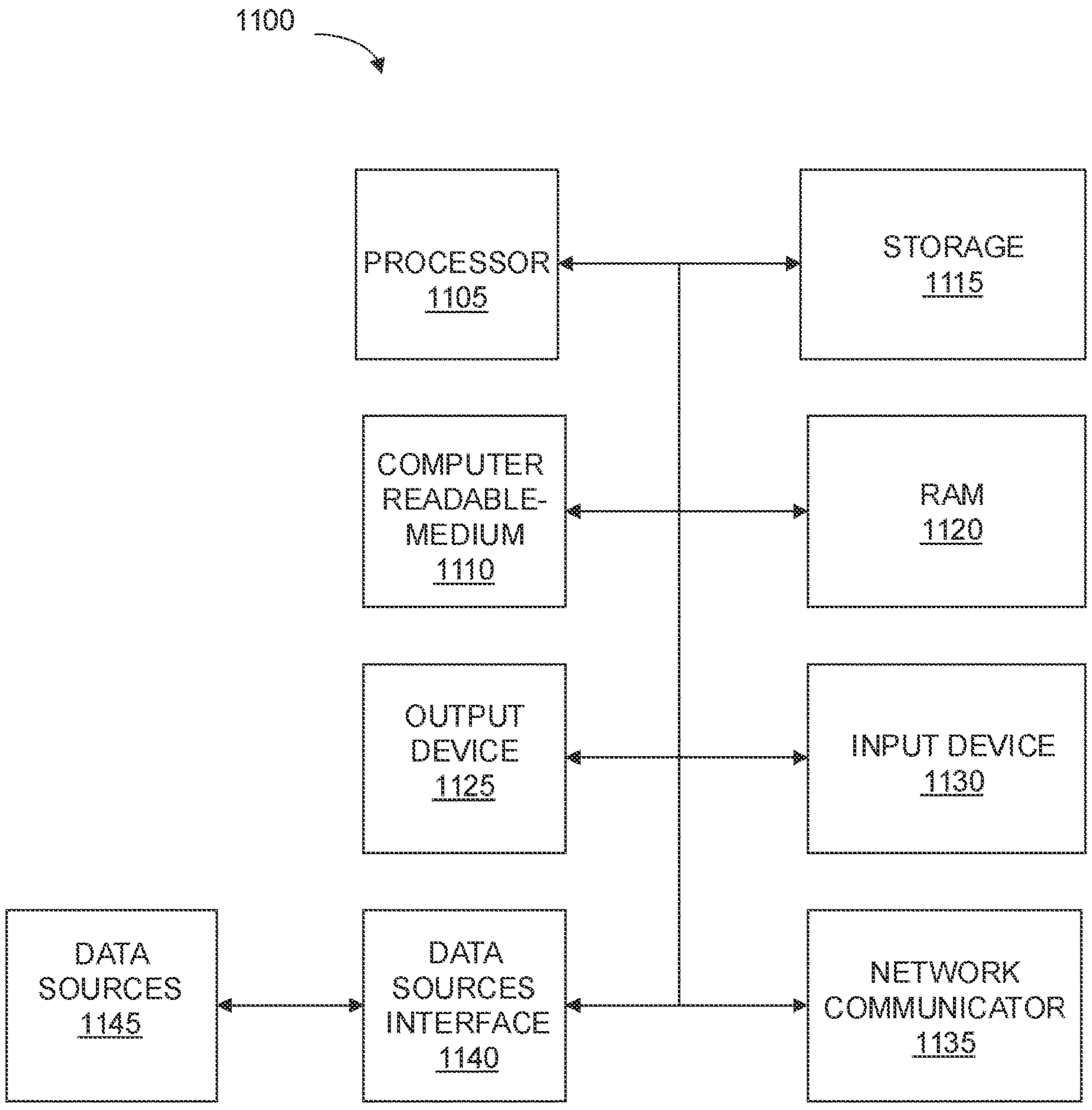
FIG. 11 illustrates a block diagram representation of a hardware platform for implementation of a computer system, according to an example.

FIG. 11 illustrates a block diagram representation of a hardware platform 1100 for implementation of a computer system, according to an example. The computer system may be part of any one of the components of, or the system 102. For the sake of brevity, construction, and operational features of the system 102 which are explained in detail above are not explained in detail herein. Particularly, computing machines such as, but not limited to, internal/external server clusters, quantum computers, desktops, laptops, smartphones, tablets, and wearables which may be used to execute the system 102 or may have the structure of the hardware platform. As illustrated, the hardware platform 1100 may include additional components not shown, and that some of the components described may be removed and/or modified. For example, a computer system with multiple GPUs may be located on external-cloud platforms including web services, or internal corporate cloud computing clusters, or organizational computing resources, and the like.

The hardware platform 1100 may be a computer system such as the system 102 that may be used with the examples described herein. The computer system may represent a computational platform that includes components that may be in a server or another computer system. The computer system may execute, by the processor 1105 (for example, a single or multiple processors) or other hardware processing circuit, the methods, functions, and other processes described herein. These methods, functions, and other processes may be embodied as machine-readable instructions stored on a computer-readable medium, which may be non-transitory, such as hardware storage devices (for example, RAM (random access memory), ROM (read-only memory), EPROM (erasable, programmable ROM), EEPROM (electrically erasable, programmable ROM), hard drives, and flash memory). The computer system may include the processor 1105 that executes software instructions or code stored on a non-transitory computer-readable storage medium 1110 to perform methods of the present disclosure.

The instructions on the computer-readable storage medium 1110 are read and stored the instructions in storage 1115 or in random access memory (RAM) 1120. The storage 1115 may provide a space for keeping static data where at least some instructions could be stored for later execution. The stored instructions may be further compiled to generate other representations of the instructions and dynamically stored in the RAM such as RAM 1120. The processor 1105 may read instructions from the RAM 1120 and perform actions as instructed.

The computer system may further include the output device 1125 to provide at least some of the results of the execution as output including, but not limited to, visual information to users, such as external agents. The output device 1125 may include a display on computing devices and virtual reality glasses. For example, the display may be a mobile phone screen or a laptop screen. GUIs and/or text may be presented as an output on the display screen. The computer system may further include an input device 1130 to provide a user or another device with mechanisms for entering data and/or otherwise interact with the computer system. The input device 1130 may include, for example, a keyboard, a keypad, a mouse, or a touchscreen. Each of these output devices 1125 and input device 1130 may be joined by one or more additional peripherals. For example, the output device 1125 may be used to display the results.

A network communicator 1135 may be provided to connect the computer system to a network and in turn to other devices connected to the network including other clients, servers, data stores, and interfaces, for instance. A network communicator 1135 may include, for example, a network adapter such as a LAN adapter or a wireless adapter. The computer system may include a data sources interface 1140 to access the data source 1145. The data source 1145 may be an information resource. As an example, a database of exceptions and rules may be provided as the data source 1145. Moreover, knowledge repositories and curated data may be other examples of the data source 1145.

Figure 12:
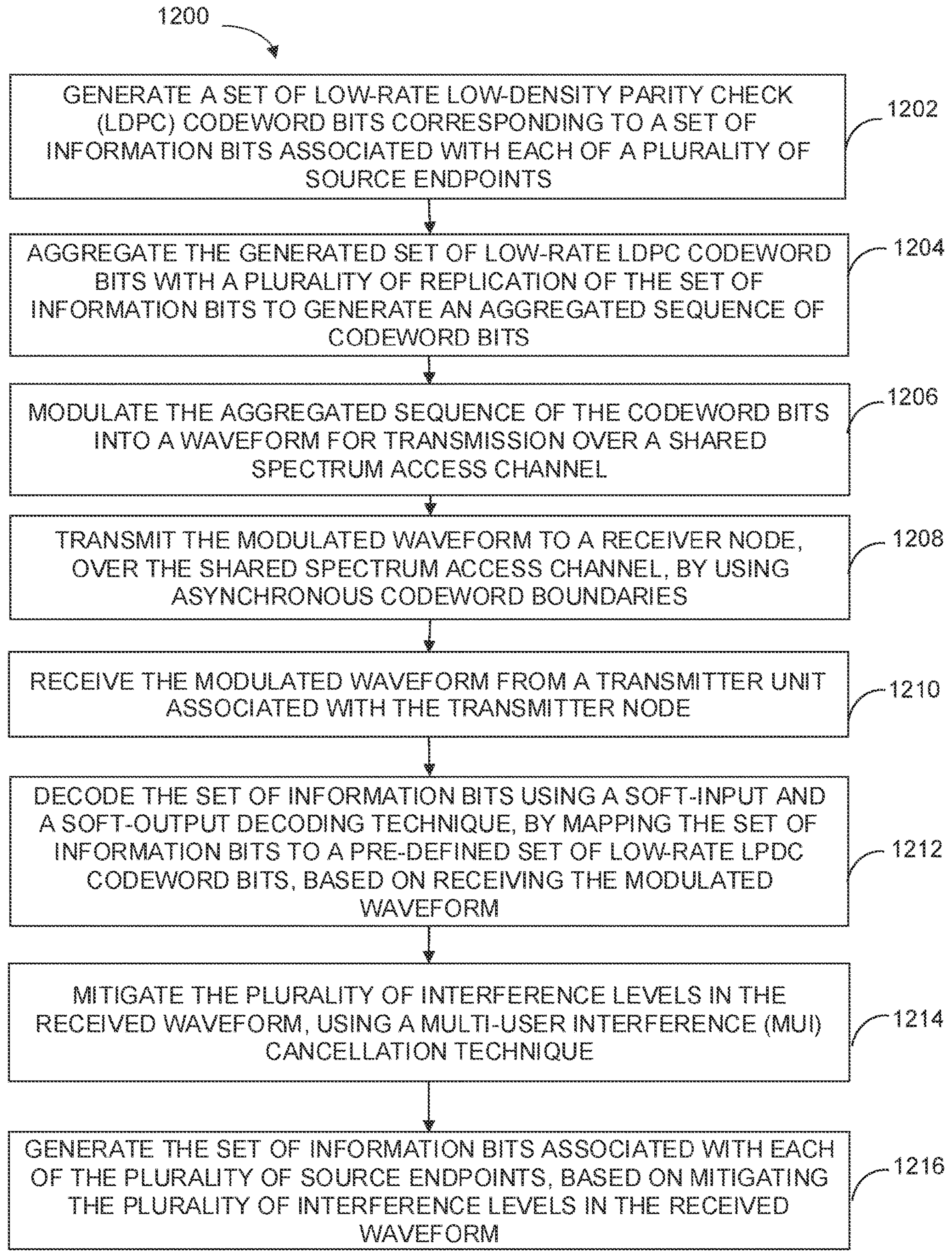
FIG. 12 illustrates a flow diagram representation depicting a method for generating Low-Density Parity-Check (LDPC) codes in an Asynchronous Scrambled Coded Multiple Access (ASCMA) telecommunication network, according to an example.

FIG. 12 illustrates a flow diagram representation depicting a method 1200 for generating Low-Density Parity-Check (LDPC) codes in an Asynchronous Scrambled Coded Multiple Access (ASCMA) telecommunication network, according to an example.

At step 1202, the method 1200 includes generating, by the processor 202 associated with the transmitter node 126, a set of low-rate Low-Density Parity Check (LDPC) codeword bits corresponding to a set of information bits associated with each of a plurality of source endpoints.

At step 1204, the method 1200 includes aggregating, by the processor 202 associated with the transmitter node 126, the generated set of low-rate LDPC codeword bits with a plurality of replication of the set of information bits to generate an aggregated sequence of codeword bits.

At step 1206, the method 1200 includes modulating, by the processor 202 associated with the transmitter node 126, the aggregated sequence of the codeword bits into a waveform for transmission over a shared spectrum access channel.

At step 1208, the method 1200 includes transmitting, by the processor 202 associated with the transmitter node 126, the modulated waveform to a receiver node, over the shared spectrum access channel, by using asynchronous codeword boundaries.

At step 1210, the method 1200 includes receiving, by the processor 202 associated with the receiver node 104, the modulated waveform from a transmitter unit associated with the transmitter node 126. The received waveform is a noise corrupted version of the transmitted waveform.

At step 1212, the method 1200 includes decoding, by the processor 202 associated with the receiver node 104, the set of information bits using a soft-input and a soft-output decoding technique, based on receiving the modulated waveform.

At step 1214, the method 1200 includes mitigating, by the processor 202 associated with the receiver node 104, the plurality of interference levels in the received waveform, using a Multi-User Interference (MUI) cancellation technique.

At step 1216, the method 1200 includes generating, by the processor 202 associated with the receiver node 104, the set of information bits associated with each of the plurality of source endpoints, based on mitigating the plurality of interference levels in the decoded set of information bits received waveform.

The order in which the method 1200 is described is not intended to be construed as a limitation, and any number of the described method blocks may be combined or otherwise performed in any order to implement the method 1200 or an alternate method. Additionally, individual blocks may be deleted from the method 1200 without departing from the spirit and scope of the ongoing description. Furthermore, the method 1200 may be implemented in any suitable hardware, software, firmware, or a combination thereof, that exists in the related art or that is later developed. The method 1200 describes, without limitation, the implementation of the system 102. A person of skill in the art will understand that method 1200 may be modified appropriately for implementation in various manners without departing from the scope and spirit of the ongoing description.

Various examples of the present disclosure provide systems and methods for generating Low-Density Parity-Check (LDPC) code for enabling access to multiple simultaneous users in Asynchronous Scrambled Coded Multiple Access (ASCMA) telecommunication network. The proposed low-rate Low-Density Parity-Check (LDPC) code may be designed to better align with the soft input/soft output multi-user interference cancellation algorithm used in the ASCMA. By improving compatibility of the LDPC code with the typical interference levels and Signal-to-Noise Ratios (SNR) encountered in in-route transmissions, the present disclosure allows for a reduction in the SNR requirement for terminals. Alternatively, for a given SNR, the LDPC code enables the support of a higher number of simultaneous users. This advancement is particularly valuable in high-density communication scenarios where maximizing user capacity while maintaining signal integrity is crucial.

The proposed invention may be characterized by a higher rate compared to the legacy ASCMA code. This implies, for a given number of information bits, the new code can achieve the same number of coded bits as the legacy code by employing multiple repetitions of the information bits. As a result, the base codeword length used in the decoding algorithm is shorter, leading to a decrease in computational complexity per iteration. Additionally, the new code requires fewer iterations to converge, which further reduces the complexity and processing time of the decoding algorithm. This streamlined process contributes to increased throughput and overall system efficiency.

The proposed ASCMA approach inherently mitigates multi-user interference by allowing codewords to overlap in time and frequency in a more flexible manner compared to SCMA. With ASCMA, different parts of codewords experience varying levels of interference, enabling more effective decoding through cleaner regions of codewords. The enhanced matching of the proposed LDPC code with the ASCMA algorithm helps in optimizing the interference management, resulting in better overall performance in terms of error rates and signal clarity.

One of ordinary skill in the art will appreciate that techniques consistent with the ongoing description are applicable in other contexts as well without departing from the scope of the ongoing description.

As mentioned above, what is shown and described with respect to the systems and methods above are illustrative. While examples described herein are directed to configurations as shown, it should be appreciated that any of the components described or mentioned herein may be altered, changed, replaced, or modified, in size, shape, and numbers, or material, depending on application or use case, and adjusted for managing handoff.

It should also be appreciated that the systems and methods, as described herein, may also include, or communicate with other components not shown. For example, these may include external processors, counters, analyzers, computing devices, and other measuring devices or systems. This may also include middleware (not shown) as well. The middleware may include software hosted by one or more servers or devices. Furthermore, it should be appreciated that some of the middleware or servers may or may not be needed to achieve functionality. Other types of servers, middleware, systems, platforms, and applications not shown may also be provided at the back end to facilitate the features and functionalities of the testing and measurement system.

Moreover, single components may be provided as multiple components, and vice versa, to perform the functions and features described herein. It should be appreciated that the components of the system described herein may operate in partial or full capacity, or it may be removed entirely. It should also be appreciated that analytics and processing techniques described herein with respect to the optical measurements, for example, may also be performed partially or in full by other various components of the overall system.

It should be appreciated that data stores may also be provided to the apparatuses, systems, and methods described herein, and may include volatile and/or non-volatile data storage that may store data and software or firmware including machine-readable instructions. The software or firmware may include subroutines or applications that perform the functions of the measurement system and/or run one or more application that utilize data from the measurement or other communicatively coupled system.

The various components, circuits, elements, components, and interfaces may be any number of mechanical, electrical, hardware, network, or software components, circuits, elements, and interfaces that serves to facilitate communication, exchange, and analysis data between any number of or combination of equipment, protocol layers, or applications. For example, the components described herein may each include a network or communication interface to communicate with other servers, devices, components or network elements via a network or other communication protocol.

What has been described and illustrated herein are examples of the implementation along with some variations. The terms, descriptions, and figures used herein are set forth by way of illustration only and are not meant as limitations.

Many variations are possible within the scope of the implementations, which is intended to be defined by the following claims—and their equivalents—in which all terms are meant in their broadest reasonable sense unless otherwise indicated.

The invention claimed is:

1. A system comprising:

a transmitter node comprising a plurality of source endpoints associated with an Asynchronous Scrambled Coded Multiple Access (ASCMA) telecommunication network, each of the plurality of source endpoints comprising:

an encoder to:

generate a set of low-rate Low-Density Parity Check (LDPC) codeword bits corresponding to a set of information bits associated with each of the plurality of source endpoints;

aggregate the generated set of low-rate LDPC codeword bits with a plurality of replication of the set of information bits to generate an aggregated sequence of codeword bits;

a modulator communicatively coupled to the encoder to:

modulate the aggregated sequence of the codeword bits into a waveform for transmission over a shared spectrum access channel;

a transmitter communicatively coupled to the modulator to:

transmit the modulated waveform to a receiver node, over the shared spectrum access channel, by using asynchronous codeword boundaries;

the receiver node comprising a gateway associated with a plurality of destination endpoints in the ASCMA telecommunication network, the gateway comprising:

a receiver to:

receive the modulated waveform from the transmitter associated with the transmitter node, wherein the received waveform is a noise corrupted version of the transmitted waveform;

a decoder associated with the receiver to:

decode the set of information bits using a soft-input and a soft-output decoding technique, based on the received modulated waveform;

a Multi-User Interference (MUI) estimator communicatively coupled to the decoder and a processor, wherein the MUI estimator causes the processor to:

mitigate a plurality of interference levels in the received waveform, using a Multi-User Interference (MUI) cancellation technique; and the decoder is to:

generate the set of information bits associated with each of the plurality of source endpoints, based on mitigating the plurality of interference levels in the received waveform.

2. The system of claim 1, wherein the transmitter is further to:

encode the set of information bits from each of the plurality of source endpoints using respective Forward Error Correction (FEC) encoders;

scramble, via each of plurality of scramblers, the encoded set of information bits from each of the plurality of source endpoints; and modulate, via each of plurality of scramblers and the modulator, the scrambled set of encoded bits.

3. The system of claim 1, further comprising:

optimize a structure associated with a pre-defined low-rate LDPC code, using an Extrinsic Information Transfer (EXIT) chart technique.

4. The system of claim 1, wherein the MUI estimator causes the processor to use an elementary symbol estimator (ESE) technique to evaluate plurality of modulated waveform of the source endpoints as a Gaussian process.

5. The system of claim 1, wherein the low-rate comprises m/n rate of the LDPC codeword bits to be aggregated with the plurality of replication of the set of information bits.

6. The system of claim 5, wherein the m/n rate comprises smaller block size at the decoder for lower decoder complexity at the decoder.

7. The system of claim 1, wherein the decoder comprises Forward Error Correction (FEC) decoders for generating error corrected set of information bits.

8. A method comprising:

generating, by a processor associated with a transmitter node, a set of low-rate Low-Density Parity Check (LDPC) codeword bits corresponding to a set of information bits associated with each of a plurality of source endpoints;

aggregating, by the processor associated with the transmitter node, the generated set of low-rate LDPC codeword bits with a plurality of replication of the set of information bits to generate an aggregated sequence of codeword bits;

modulating, by the processor associated with the transmitter node, the aggregated sequence of the codeword bits into a waveform for transmission over a shared spectrum access channel;

transmitting, by the processor associated with the transmitter node, the modulated waveform to a receiver node, over the shared spectrum access channel, by using asynchronous codeword boundaries;

receiving, by the processor associated with the receiver node, the modulated waveform from a transmitter associated with the transmitter node, wherein the received waveform is a noise corrupted version of the transmitted waveform;

decoding, by the processor associated with the receiver node, the set of information bits using a soft-input and a soft-output decoding technique, based on the received modulated waveform;

mitigating, by the processor associated with the receiver node, a plurality of interference levels in the received waveform, using a Multi-User Interference (MUI) cancellation technique; and generating, by the processor associated with the receiver node, the set of information bits associated with each of the plurality of source endpoints, based on mitigating the plurality of interference levels in the received waveform.

9. The method of claim 8, wherein the method further comprises:

encoding, by the processor associated with the transmitter node, the set of information bits from each of the plurality of source endpoints using respective Forward Error Correction (FEC) encoders;

scrambling, by the processor associated with the transmitter node, via each of plurality of scramblers, the encoded set of information bits from each of the plurality of source endpoints; and modulating, by the processor associated with the transmitter node, via each of plurality of scramblers and a modulator, the scrambled set of coded bits.

10. The method of claim 8, further comprising:

optimizing, by the processor associated with the transmitter node, a structure associated with the low-rate LDPC code, using an Extrinsic Information Transfer (EXIT) chart technique.

11. The method of claim 8, wherein the plurality of modulated waveform of the source endpoints as a Gaussian process is evaluated using an elementary symbol estimator (ESE) technique.

12. The method of claim 8, wherein the low-rate comprises m/n rate of the LDPC codeword bits to be aggregated with the plurality of replication of the set of information bits.

13. The method of claim 12, wherein the m/n rate comprises smaller block size at a decoder for lower decoder complexity at the decoder.

14. The method of claim 8, wherein decoding comprises decoding the set of information bits using Forward Error Correction (FEC) decoders for generating error corrected set of information bits.

15. A non-transitory computer-readable medium comprising processor-executable instructions that cause a processor to:

generate a set of low-rate Low-Density Parity Check (LDPC) codeword bits corresponding to a set of information bits associated with each of a plurality of source endpoints;

aggregate the generated set of low-rate LDPC codeword bits with a plurality of replication of the set of information bits to generate an aggregated sequence of codeword bits;

modulate the aggregated sequence of the codeword bits into a waveform for transmission over a shared spectrum access channel;

transmit the modulated waveform of the codeword bits to a receiver node, over the shared spectrum access channel, by using asynchronous codeword boundaries;

receive the modulated waveform from a transmitter associated with a transmitter node, wherein the received waveform is a noise corrupted version of the transmitted waveform;

decode the set of information bits using a soft-input and a soft-output decoding technique, based on the received modulated waveform;

mitigate the plurality of interference levels in the received waveform, using a Multi-User Interference (MUI) cancellation technique; and generate the set of information bits associated with each of a plurality of source endpoints, based on mitigating the plurality of interference levels in the received waveform.

16. The non-transitory computer-readable medium of claim 15, wherein the processor is further to:

encode the set of information bits from each of the plurality of source endpoints using respective Forward Error Correction (FEC) encoders;

scramble, via each of plurality of scramblers, the encoded set of information bits from each of the plurality of source endpoints; and modulate, via each of plurality of scramblers and a modulator, the scrambled set of encoded bits.

17. The non-transitory computer-readable medium of claim 15, wherein the processor is further to:

optimize a structure associated with the low-rate LDPC code, using an Extrinsic Information Transfer (EXIT) chart technique.

18. The non-transitory computer-readable medium of claim 15, wherein the plurality of modulated waveform of the source endpoints is evaluated as a Gaussian process using an Elementary Symbol Estimator (ESE) technique.

19. The non-transitory computer-readable medium of claim 15, wherein the low-rate comprises m/n rate of the LDPC codeword bits to be aggregated with the plurality of replication of the set of information bits.

20. The non-transitory computer-readable medium of claim 19, wherein the m/n rate comprises smaller block size at a decoder for lower decoder complexity at the decoder.

* * * * *